(12) United States Patent
Okayama

(10) Patent No.: US 8,391,041 B2
(45) Date of Patent: Mar. 5, 2013

(54) MAGNETIC MEMORY DEVICE

(75) Inventor: Shota Okayama, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/466,782

(22) Filed: May 8, 2012

(65) Prior Publication Data

US 2012/0218804 A1    Aug. 30, 2012

Related U.S. Application Data

(62) Division of application No. 12/611,600, filed on Nov. 3, 2009, now Pat. No. 8,199,550.

(30) Foreign Application Priority Data

Nov. 13, 2008  (JP) ................................. 2008-291250

(51) Int. Cl.
*G11C 5/02* (2006.01)
*G11C 5/08* (2006.01)
*G11C 11/00* (2006.01)

(52) U.S. Cl. ............ 365/51; 365/66; 365/158; 365/171; 365/173

(58) Field of Classification Search ................... 365/51, 365/66, 158, 171, 173
See application file for complete search history.

(56) References Cited

U.S. PATENT DOCUMENTS

| | | | |
|---|---|---|---|
| 6,661,689 B2 | 12/2003 | Asao et al. | |
| 7,141,842 B2 | 11/2006 | Kajiyama | |
| 7,164,598 B2 | 1/2007 | Jeong et al. | |
| 7,286,394 B2 | 10/2007 | Ooishi | |
| 7,362,607 B2 | 4/2008 | Motoyoshi | |
| 2007/0285974 A1 | 12/2007 | Takemura et al. | |
| 2009/0027964 A1 | 1/2009 | Arai | |
| 2012/0113731 A1* | 5/2012 | Shimano et al. | ......... 365/189.15 |

FOREIGN PATENT DOCUMENTS

| | | |
|---|---|---|
| JP | 2002-270790 | 9/2002 |
| JP | 2005-108973 | 4/2005 |
| JP | 2005-311132 | 11/2005 |
| JP | 2006-054046 | 2/2006 |
| JP | 2007-311514 | 11/2007 |
| JP | 2007-317948 | 12/2007 |

* cited by examiner

*Primary Examiner* — Ly D Pham

(74) *Attorney, Agent, or Firm* — McDermott Will & Emery LLP

(57) ABSTRACT

The present invention provides a magnetic memory device capable of providing high-speed access without increasing an array area. Gate word lines are respectively linearly disposed between source impurity regions and drain impurity regions within a memory cell array area. Gate word line protrusions are respectively provided at boundary regions of memory cell forming regions. Contacts relative to the gate word line protrusions are respectively provided at boundary regions of memory cells at adjacent columns. The drain impurity regions are respectively disposed with being shifted from the centers of the memory cell forming regions in such a manner that spaces between the drain impurity regions become large in the regions in which the protrusions are disposed.

1 Claim, 25 Drawing Sheets

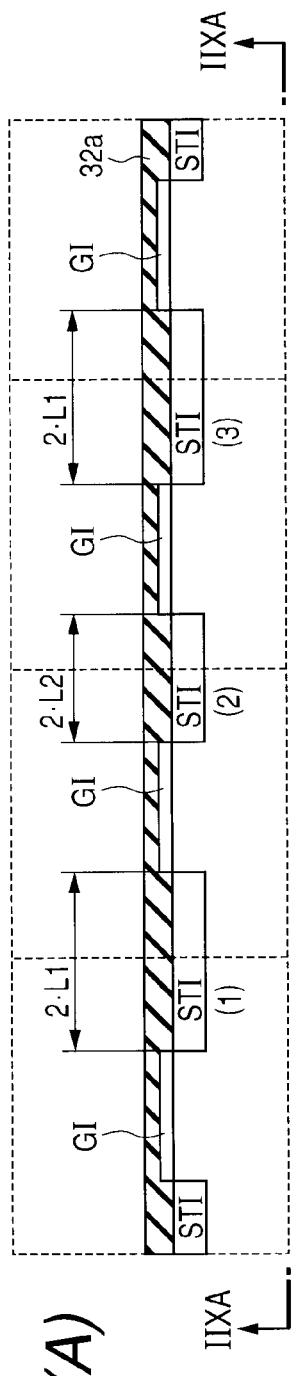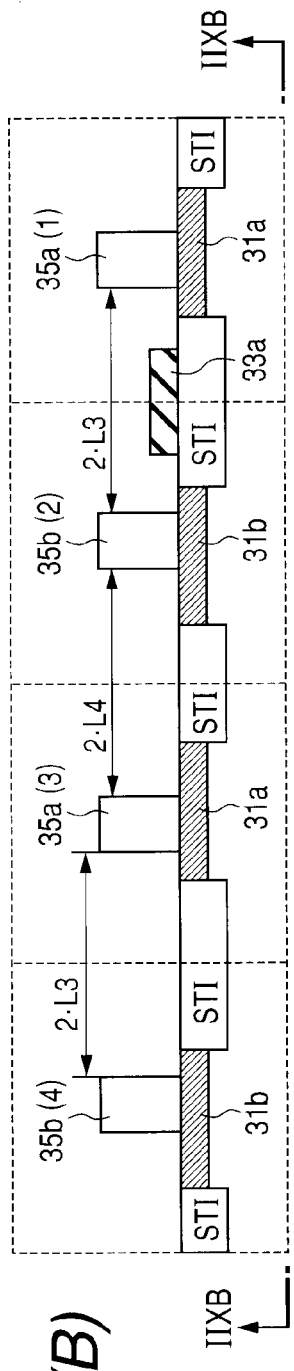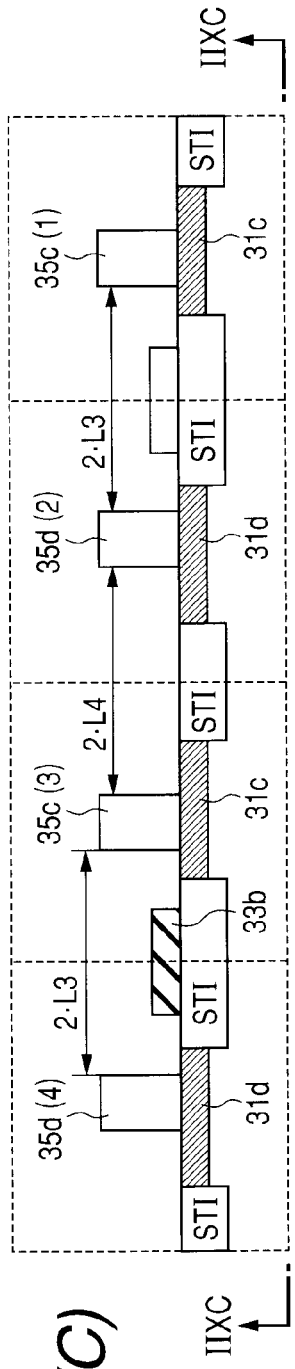

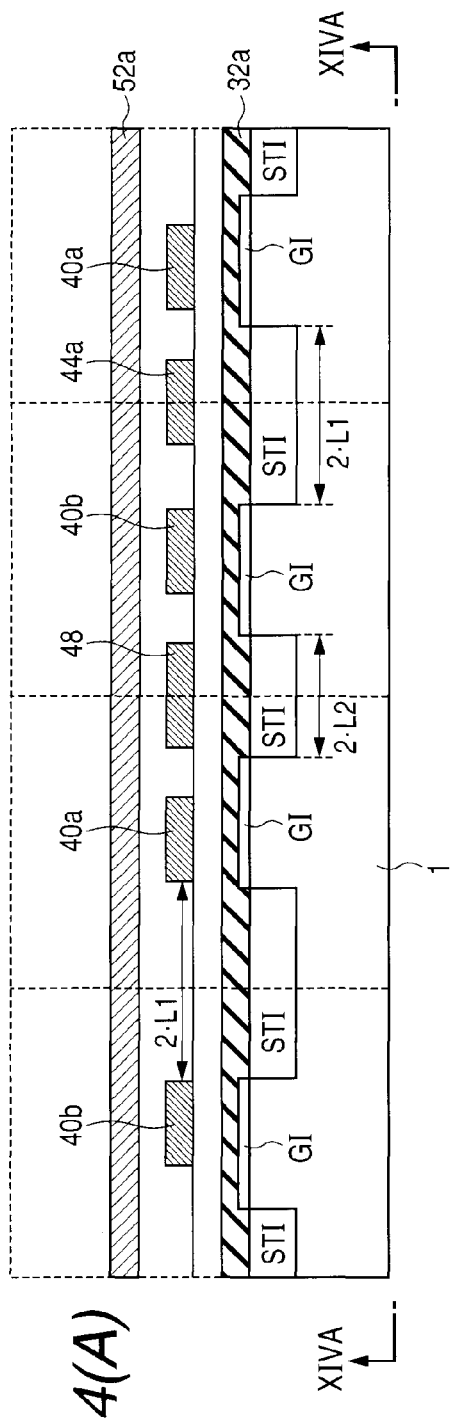
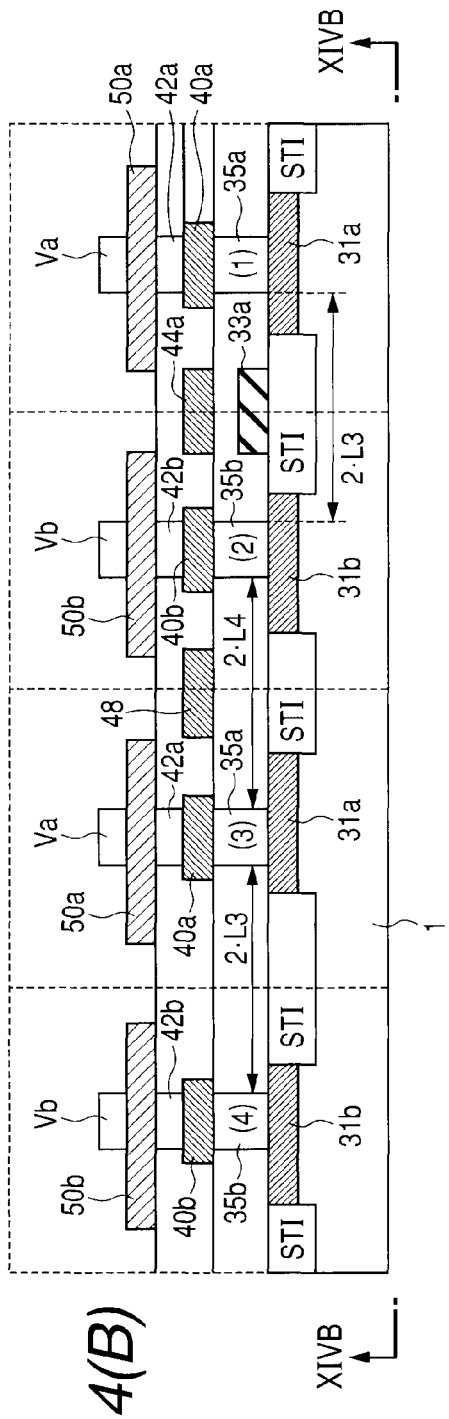
FIG. 14(A)
FIG. 14(B)

MAGNETIC MEMORY DEVICE

CROSS-REFERENCE TO RELATED APPLICATIONS

This application is a Divisional of U.S. Application Ser. No. 12/611,600, filed on Nov. 3, 2009 now U.S. Pat. No. 8,199,550, claiming priority of Japanese Patent Application No. 2008-291250 filed on Nov. 13, 2008 the entire contents of each of which are hereby incorporated by reference.

BACKGROUND OF THE INVENTION

The present invention relates to a magnetic memory device, and particularly to a configuration of an array of a magnetic memory device capable of implementing high-speed access without increasing an area occupied by a memory cell array.

As one of memory devices that store data therein on a non-volatile basis, there is known an MRAM (magnetic random access memory). The MRAM makes use of a variable magnetoresistive element for data storage. The variable magnetoresistive element has a TMR (tunneling magnetoresistive) element or an MTJ (magnetic tunneling junction) element. In either configuration, the variable magnetoresistive element has a fixed layer in which its direction of magnetization is fixed regardless of stored data, a free layer in which the direction of magnetization is set according to the stored data, and a barrier layer provided between the fixed layer and the free layer. When the free layer and the fixed layer coincide in magnetization direction with each other, an electrical resistance relative to the current that passes through the variable magnetoresistive element is small. On the other hand, when the free layer and the fixed layer are opposite in the magnetization direction, the electrical resistance becomes large. The magnitude of this resistance value is associated with data "0" and "1".

The MRAM cell uses a data storage magneto-resistive effect. Thus, it is different from such a configuration that an electrical charge is stored in a floating gate or an insulating film as in a flash memory. There exists no limitation to the number of rewritings due to deterioration of an interlayer insulating film and the like. It is not necessary to perform the storage of an electrical charge into a charge storage layer (or insulating film) or its discharge upon data storage. The setting of a magnetization direction is simply performed. Since this magnetization inversion occurs in a short time, the writing of data can be performed at high speed.

When a processing system is built using such an MRAM, the MRAM needs to obtain high-speed access and reduce a layout area in terms of speeding-up of the whole system and its size reduction. In built-in applications such as SOC (System On Chip) in particular, there is a strong demand for a reduction in the layout area along with high-speed access.

A configuration for achieving a reduction in the layout area of a memory array for MRAM has been disclosed in a patent document 1 (Japanese Unexamined Patent Publication No. 2007-317948). In the configuration disclosed in the patent document 1, each MRAM cell comprises a series body of a magnetic memory transistor and a selection transistor. A source line for the selection transistor of each MRAM cell is shared by selection transistors of each adjacent row. A reduction in the layout area of each cell is achieved by sharing the source line between the adjacent cells.

A patent document 2 (Japanese Unexamined Patent Publication No. 2005-311132) discloses a configuration which achieves a reduction in variations in magnetic field at the writing of data into each MRAM cell. Namely, in the configuration disclosed in the patent document 2, selection transistors are disposed mirror-symmetrically so as to share a source line. On the other hand, upper wirings coupled to variable magnetoresistive elements are provided translation-symmetrically. With the translational symmetry, wirings lying above the selection transistors are disposed in a high density. Thus, the variable magnetoresistive elements are disposed at equal intervals and the proximity effect of the magnetic field is made uniform with respect to each variable magnetoresistive element, thereby reducing the variations in the magnetic field at the data writing.

A configuration for achieving the avoidance of crosstalk between wirings laid out in a high density has been disclosed in a patent document 3 (Japanese Unexamined Patent Publication No. 2002-270790). Also in the configuration shown in the patent document 3, selection transistors of MRAM cells are disposed mirror-symmetrically, and upper wirings relative to variable magnetoresistive elements are disposed translation-symmetrically. In the patent document 3, electrical current is caused to flow into a write word line adjacent to a selected row in the direction opposite to the write word line at the selected row upon the data writing, thereby avoiding miswriting to each adjacent cell.

A patent document 4 (Japanese Unexamined Patent Publication No. 2005-108973) has disclosed a configuration for achieving a reduction in crosstalk between wirings of a core/peripheral circuit section at an MRAM using TMR elements. In the configuration shown in the patent document 4, components for core/peripheral circuits and a memory array are formed by the same process. As to memory cells, upper wirings have translational symmetry and selection transistors are disposed mirror-symmetrically. In the core/peripheral circuit section, crosstalk where a dummy of the TMR element is disposed and a bit line and a write word line are disposed close to each other can be avoided by the dummy TMR element.

A configuration of a spin injection MRAM using spin injection in the MRAM has been disclosed in a patent document 5 (Japanese Unexamined Patent Publication No. 2006-54046) and a patent document 6 (Japanese Unexamined Patent Publication No. 2007-311514). The spin injection MRAM causes a write current to flow through a variable magnetoresistive element in the direction corresponding to the logical value of write data. The direction of magnetization of a free layer is set according to a spin deflection direction of the write current. Also in the configuration shown in the patent document 5, selection transistors of adjacent MRAM cells share a source region therefor and are disposed mirror-symmetrically.

In the patent document 6, the variable magnetoresistive element makes use of an N channel MOS transistor (insulated gate field effect transistor) or a P channel MOS transistor as a selection transistor depending on its coupling mode so as to suppress the influence of the threshold voltage of each selection transistor upon data writing. As to a write current, a write current at the time that rewriting is performed in a magnetizing anti-parallel direction is larger than a current required upon writing to a magnetizing parallel state. Upon this writing, the write current is caused to flow at source ground to thereby allow a large current to flow. Upon reading, the current is caused to flow in the same direction as upon writing to the anti-parallel state, thereby allowing a large current to flow upon the reading.

SUMMARY OF THE INVENTION

In order to read data at high speed, there is a need to set a selection transistor of each MRAM cell to a conducting state as rapidly as possible. The gates of selection transistors of many MRAM cells are coupled to a word line and load capacitances (parasitic capacitances) thereof are large. A so-called word line piling structure is normally used in a DRAM (Dynamic Random Access Memory) and gate wirings of selection transistors are electrically coupled to their corresponding upper metal wirings low in resistance at predetermined intervals. In the case of the normal DRAM, however, word line piling regions thereof are provided in regions or the like free of provision of memory cells, for example, between memory blocks, and so-called word line shut regions are required additionally. Therefore, if the word line piling structure of the DRAM is applied to the MRAM as it is, it is then difficult to reduce the layout area of a memory cell array.

Although the configuration for laying out the MRAM cells in the high density has been shown in the patent documents 1 through 6, the word line piling structure is not shown therein.

Upon data reading of each MRAM cell, the current is caused to flow between the bit line and the source line via the MRAM cell. The source line is normally comprised of a diffusion layer (impurity layer) and a metal wiring. The reading of data is performed by detecting the current that flows through the bit line or the source line. Thus, in order to read the data accurately and at high speed, there is a need to set the resistance of the source line as small as possible (this is done to prevent the floating-up or rising of a ground potential due to the current of the source line or to cause a large current to flow where the source line is grounded).

Although such a configuration that the source line (inclusive of diffusion layer and metal wiring) is shared between the adjacent MRAM cells is shown in the configurations shown in the patent documents 1 through 6, such a configuration that the resistance of the source line is further reduced is not shown therein. A problem arises in that when the width of a metal source wiring is simply made broad for the purpose of a reduction in the resistance, the area of each MRAM cell also increases so that the layout area of each MRAM cell cannot be reduced.

The reduction in the number of the source-line wirings and the configuration realized by sharing the source line by the adjacent MRAM cells are merely shown in the patent documents 1 through 6. Such a configuration that the resistance of the source line is further reduced without increasing the layout area of each MRAM cell is not shown.

Upon data reading, the reading of data stored in each selected MRAM cell is done by comparing the current flowing via the MRAM cell with the current flowing through a dummy cell in which its data stored value is fixed. In this case, there is a need to accurately generate a reference current with respect to the data stored in the MRAM cell for the purpose of performing the reading of data accurately.

As dummy cells (reference cells) for generating reference currents, a reference cell placed in a high resistance state and a reference cell placed in a low resistance state are generally used in each MRAM. The average current of currents flowing through these two reference cells is generated and utilized as the reference current. When the resistance value of the reference cell is shifted to the high or low resistance side in this case, the magnitude of the reference current also changes correspondingly. Thus, the reference current cannot be generated accurately and the reading of data cannot be performed accurately and with quick timing, based on the difference between the current flowing through the MRAM cell and the current flowing through the reference cell.

Each of the patent documents 1 through 6 discloses no influence of a variation in the resistance value of such a reference cell.

Shape dummy cells are arranged in an array periphery to accurately perform the patterning of an array 2 with MRAM cells disposed therein and the MRAM cells. Also in the configuration shown in the patent document 2, such a configuration that dummy patterns (same patterns as TMR elements) are disposed at the outer periphery of the MRAM cell array is shown. The patent document 2, however, merely shows such a configuration that the dummy patterns are used to prevent pattern shifts in the MRAM cells in a photolithography process. Such a configuration that the area of a region in which each dummy pattern is disposed is reduced and the area of a memory cell array is reduced is not shown in the patent document 2.

An object of the present invention is therefore to provide a magnetic memory device capable of implementing high-speed access without increasing the area of an array with MRAM cells disposed therein.

There is provided a magnetic memory device according to the present invention as one embodiment, wherein a selection transistor of each MRAM cell has first and second impurity regions disposed opposite to their corresponding word lines. The distances between the first impurity regions of the MRAM cells arranged in a row direction are made different from one another with respect to first and second adjacent MRAM cells adjacent in an opposite direction as viewed in the row direction. Namely, a first distance L1 to the first impurity region of the first adjacent MRAM cell is set longer than a second distance L2 to the first impurity region of the second adjacent MRAM cell.

There is provided a magnetic memory device according to the present invention as another embodiment, wherein a shape dummy area in which shape dummy cells for accurately performing the patterning of MRAM cells are disposed, is provided at an outer periphery of a memory array. The shape dummy area has a first shape dummy area in which first shape dummy cells of the same structure as the MRAM cells, each having an MRAM cell, a variable magnetoresistive element and a selection transistor are disposed, a second shape dummy area which is disposed outside the first shape dummy area and in which a second shape dummy cell having a variable magnetoresistive element is disposed, and a third shape dummy area in which a third shape dummy cell having a dummy element of the same structure as the variable magnetoresistive element in like manner is disposed. In the second shape dummy area, an element for applying a bias to a substrate region of the memory array is disposed below its dummy element. In the third shape dummy area, a transistor of a peripheral circuit for controlling access to each MRAM cell of the memory array is disposed below the third shape dummy cell.

There is provided a magnetic memory device according to the present invention as a further embodiment, wherein dummy cells (reference cells) for generating reference currents at data reading of selected MRAM cells are disposed in the center of an MRAM cell array in alignment with MRAM cells.

Spaces along a row direction between first impurity regions are made different from each other thereby to make it possible to dispose piling regions for word lines efficiently and sufficiently ensure the distance between each of contacts for the piling regions and each of contacts for the first impurity regions. Thus, the word line piling regions are disposed with sufficient margins to thereby make it possible to realize a word line piling structure. Since the layout area of each memory cell does not increase, each word line can be brought to a reduction in the resistance sufficiently without increasing the area occupied by a memory cell array. Source wirings can be disposed in a column direction with sufficient widths. Thus, mesh-structured source lines can be realized and the resistance of each source line can be reduced.

Dummy areas are provided at the outer periphery of the memory cell array, and dummy cells different in configuration from one another are disposed in the first through third shape dummy areas. Consequently, the patterning of each MRAM cell is performed accurately and variations of variable magnetoresistive elements can be reduced. Further, peripheral circuit elements can be laid out efficiently by the second and third dummy areas. Thus, an increase in the layout area of this memory device can be suppressed.

Disposing reference cells in the center of the memory cell array makes it possible to reduce variations in the resistance value of a variable magnetoresistive element of each reference cell, generate a reference current accurately and implement accurate and high-speed data reading.

BRIEF DESCRIPTION OF THE DRAWINGS

FIG. 8(A) shows a sectional structure taken when a memory cell structure is seen in a drain region direction along line IIXA-IIXA shown in FIG. 4, FIG. 8(B) shows a sectional structure taken when a memory cell structure is seen in the drain region direction along line IIXB-IIXB shown in FIG. 4, and FIG. 8(C) shows a sectional structure taken when a memory cell structure is seen in a drain region direction along line IIXC-IIXC shown in FIG. 4;

FIG. 14(A) shows a sectional structure taken when a memory cell structure is seen in a drain region direction along line XIVA-XIVA shown in FIG. 10, and FIG. 14(B) is a diagram schematically showing a sectional structure taken when a memory structure is seen in the drain region direction along line XIVB-XIVB shown in FIG. 10;

DETAILED DESCRIPTION OF THE PREFERRED EMBODIMENTS

First Embodiment

Figure 1:
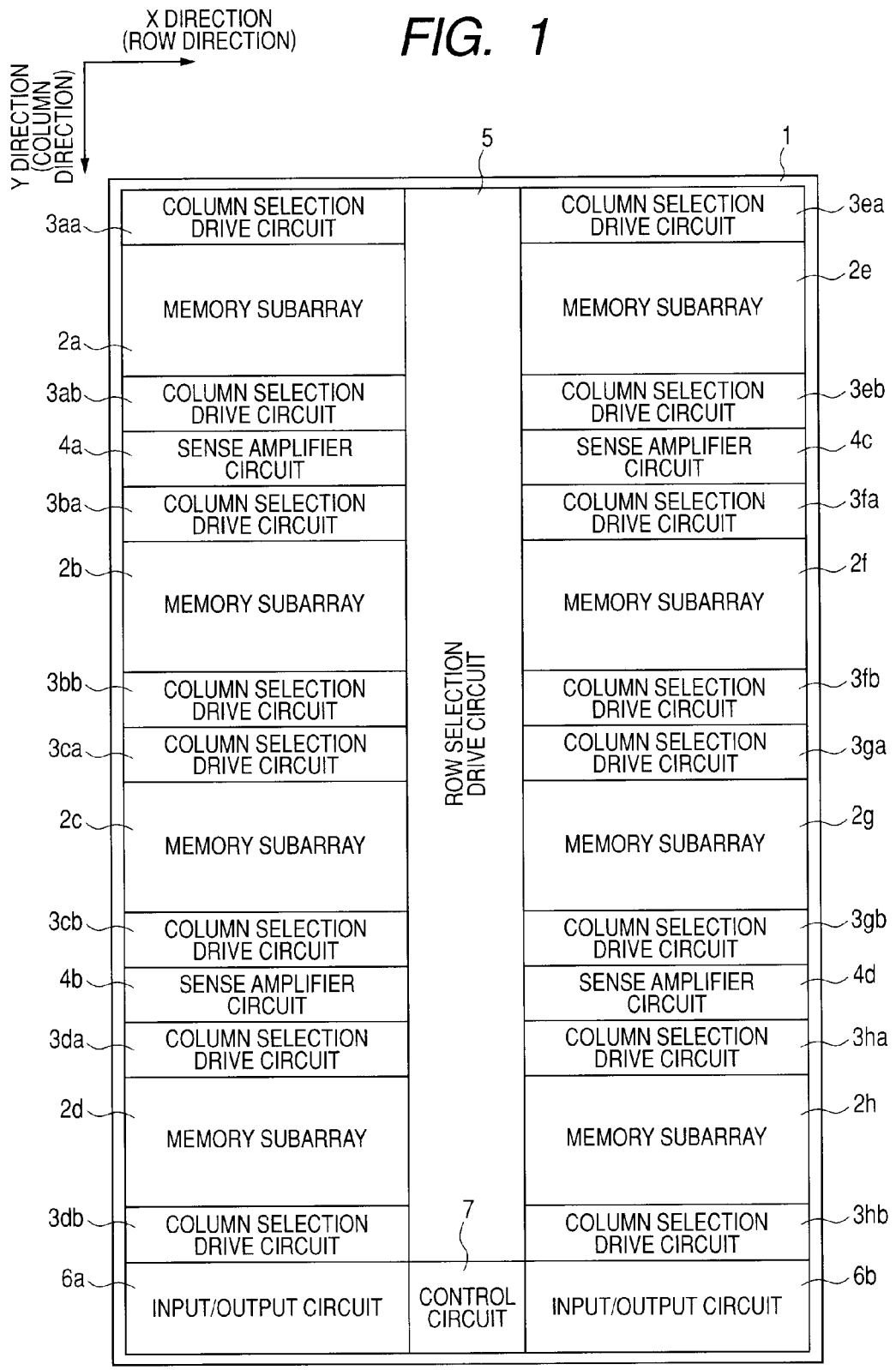
FIG. 1 is a diagram schematically showing an overall configuration of an MRAM according to a first embodiment of the present invention.

FIG. 1 is a diagram schematically showing an overall configuration of a non-volatile semiconductor memory device (MRAM) according to a first embodiment of the present invention. In FIG. 1, the non-volatile semiconductor memory device (hereinafter called "MRAM") 1 is formed over a semiconductor chip (substrate) and includes a plurality of memory subarrays 2a through 2h. The memory subarrays 2a through 2h are arranged in line in a Y direction, and the memory subarrays 2e through 2h are arranged in line along the Y direction. In these memory subarrays 2a through 2h, MRAM cells are arranged in matrix form.

Column selection drive circuits 3aa, 3ab through 3ha and 3hb are provided on both sides extending along the Y direction, of the memory subarrays 2a through 2h respectively. Each of the column selection drive circuits 3aa, 3ab through 3ha and 3hb includes a column decoder which generates a column selection signal for selecting a column in accordance with an address signal, and a bit line drive circuit which causes a write current to flow through a bit line in the direction corresponding to write data upon data writing.

Sense amplifier circuits 4a through 4b are provided in common to the two memory subarrays adjacent to each other along the Y direction. Namely, the sense amplifier circuit 4a is provided in common to the memory subarrays 2a and 2b, and the sense amplifier circuit 4b is provided in common to the memory subarrays 2c and 2d. The sense amplifier circuit 4c is provided in common to the memory subarrays 2e and 2f, and the sense amplifier circuit 4d is provided in common to the memory subarrays 2g and 2h.

The MRAM 1 makes use of a so-called open bit-line system. An MRAM cell is selected at one memory subarray, and a reference cell is selected at the paired memory subarrays (subarrays that share the sense amplifier circuit). The corresponding sense amplifier circuit compares a current that flows through the selected MRAM cell with a reference current that flows through the reference cell and performs reading of data in accordance with the result of comparison.

A row selection drive circuit 5 is provided in a central region defined between the memory subarrays 2a through 2d and the subarrays 2e through 2h in common to the memory subarrays 2a through 2h. The row selection drive circuit 5 includes a decoder for selecting a word line and a digit line, a word line driver for driving each selected word line upon data reading, and a digit line driver for driving each selected digit line upon data writing. The row selection drive circuit 5 drives a digit line of a selected row to a selected state upon data writing at the selected memory subarray and drives a word line of the selected row to a selected state upon data reading.

An input/output circuit 6a is provided in common to the memory subarrays 2a through 2d arranged in the Y direction. An input/output circuit 6b is provided in common to the memory subarrays 2a through 2h. Each of the input/output circuits 6a and 6b includes a data write circuit and a data read circuit and executes the generation of internal write data and the generation of data read to the outside.

A control circuit 7 is provided between the input/output circuits 6a and 6b. The control circuit 7 performs internal operation control necessary to execute a specified operation, in accordance with an operation mode instruction (command) given or supplied from outside. An address input circuit which inputs an address signal therein, may be included in the control circuit 7 or provided in each of the input/output circuits 6a and 6b. The specification of each memory subarray and the specification of each memory cell in the corresponding subarray are performed in accordance with the address signal.

Figure 2:
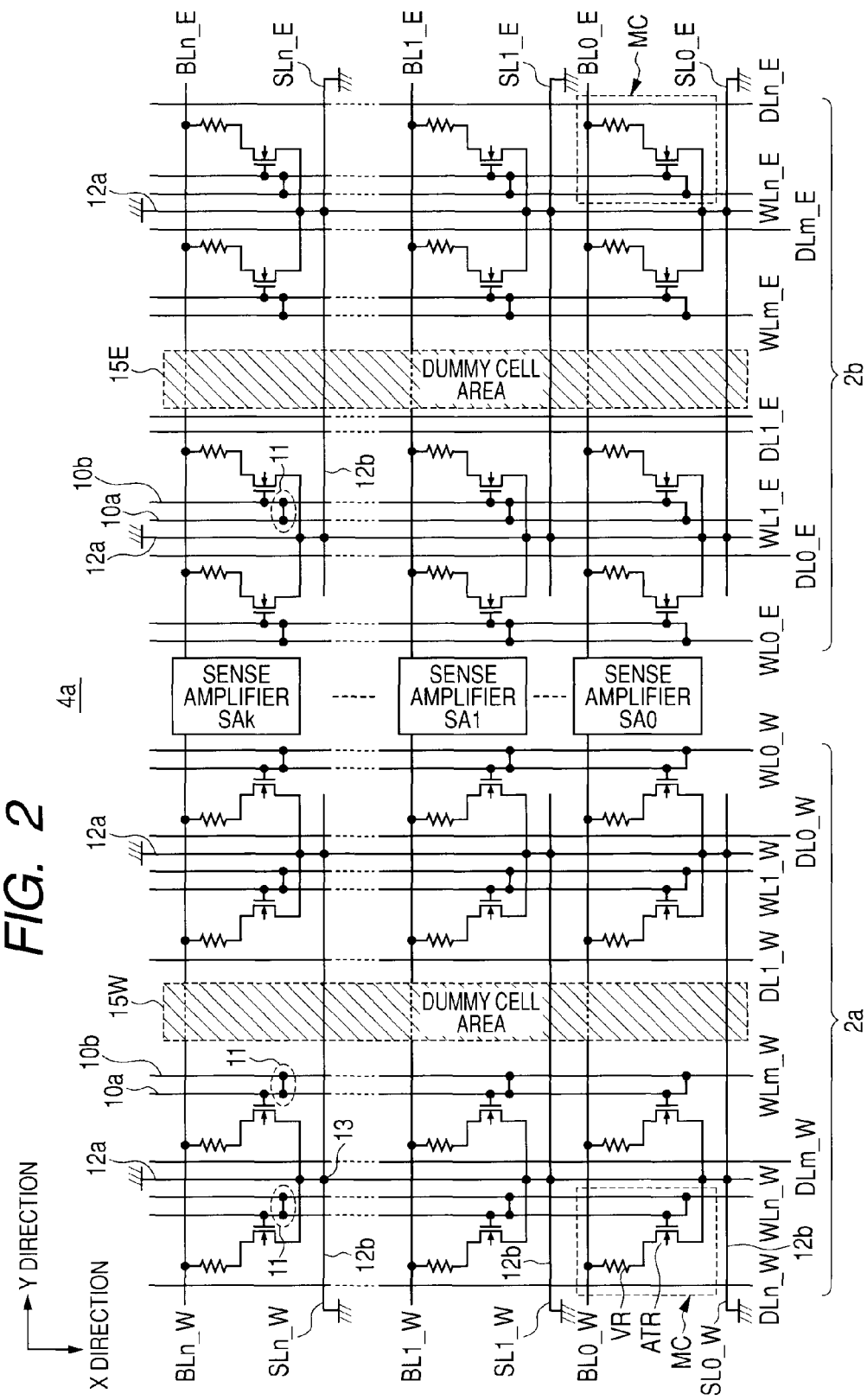
FIG. 2 is a diagram illustrating one example of configurations of memory subarrays shown in FIG. 1.

FIG. 2 is a diagram schematically showing one example of configurations of the memory subarrays and sense amplifier circuit shown in FIG. 1. Since the memory subarrays 2a through 2h and the sense amplifier circuits 4a through 4d shown in FIG. 1 are identical in configuration to one another, the configurations of the memory subarrays 2a and 2b and the sense amplifier circuit 4a are typically illustrated in FIG. 2. For simplification of drawings, the column selection drive circuits 3aa and 3ab, and 3ba and 3bb respectively provided with respect to the memory subarrays 2a and 2b are not shown in FIG. 2.

In FIG. 2, memory cells (MRAM cells) MC are arranged in matrix form in the memory subarray 2a, and memory cells (MRAM cells) MC are arranged in matrix form also in the memory subarray 2b. Each of the memory cells MC includes a series body of a variable magnetoresistive element VR and a selection transistor (access transistor) ATR. The variable magnetoresistive element VR may be a TMR element or an MTJ element.

In the memory subarray 2a, digit lines DL0_W through DLn_W and word lines WL0_W through WLn_W are respectively provided corresponding to the respective rows of the memory cells MC. Bit lines BL0_W through BLn_W are respectively provided corresponding to memory cell columns. The digit lines DL0_W through DLn_W are magnetically coupled to the variable magnetoresistive elements VR of the memory cells of their corresponding rows. The word lines WL0_W through WLn_W are respectively coupled to the gates of the access transistors of the memory cells of their corresponding rows.

Each of the word lines WL0_W through WLn_W comprises a gate word line 10a comprised of polysilicon and a metal word line 10b formed of a metal wiring disposed parallel to its upper layer. The gate word line 10a and the metal word line 10b are electrically coupled to each other by a word line shunt line 11 every four bits of each memory cell MC. In FIG. 2, the word line shunt line 11 is shown so as to be disposed with respect to each memory cell. The word lines WL0_W through WLn_W are brought to a hierarchical structure of the gate word lines 10a relatively high in resistance and the metal word lines 10b low in resistance, whereby the resistance of the gate of each access transistor is reduced and high-speed access is realized. Disposing each word line shunt line 11 in a memory cell forming region eliminates the need to provide a word line shunt forming region additionally and suppresses an increase in array area.

Source regions of the access transistors ATR of the two memory cells adjacent in the Y direction are coupled to a source diffusion wiring 12a in common. The source diffusion wiring 12a is electrically coupled to a metal source line 12b configured in an impurity region and comprised of a metal wiring extending continuously in the Y direction by means of a source contact 13. Each of the source lines SL0_W through SLn_W has a hierarchical structure of an impurity region and a metal wiring and is thereby reduced in source line resistance. Since the source diffusion wiring (impurity region) 12a is provided in common to the source regions of the access transistors of the memory cells lying in the columns adjacent to each other, the layout area of the source wiring of each access transistor can be reduced. The source lines SL0_W through SLn_W are arranged in row and column directions, and the metal source lines 12b and source diffusion wirings 12a are electrically coupled to one another at predetermined intervals. These are further coupled to their corresponding ground nodes. It is therefore possible to realize a mesh-like source wiring structure and assuredly suppress a reduction in the resistance of each source line and a variation in the potential thereof.

In a manner similar to the memory subarray 2a in the case of the memory subarray 2b, digit lines DL0_E through DLn_E and word lines WL0_G through WLn_G are provided corresponding to the respective rows of the memory cells MC. Bit lines BL0_E through BLn_E are respectively provided corresponding to memory cell columns. Source lines SL0_E through SLn_E are provided similarly.

The memory subarrays 2a and 2b are respectively provided with dummy cell areas or regions 15W and 15E in their central regions extending in the Y direction. Reference cells are disposed in the dummy cell areas 15W and 15E in alignment with the memory cell columns. Each of the reference cells has the same structure as the memory cell MC and stores fixed data therein. Upon data reading, the reference cell generates a reference current relative to a cell current that flows through each selected memory cell. The layout of the reference cells will be explained in detail later together with the mode of connection to each sense amplifier.

The sense amplifier circuit 4a is provided with sense amplifiers SA0 through SAk. The sense amplifiers SA0 through SAk are respectively provided every predetermined number of bit lines and realize parallel reading in plural bits.

Disposing the dummy cell areas 15W and 15E in the central regions in the Y direction, of the memory subarrays 2a and 2b makes it possible to suppress variations in the resistance value of the variable magnetoresistive element included in each reference cell and generate a reference current stably (the variations in the resistance value of each reference cell will also be described in detail later) as compared with where dummy cells are disposed in peripheral regions.

Figure 3:
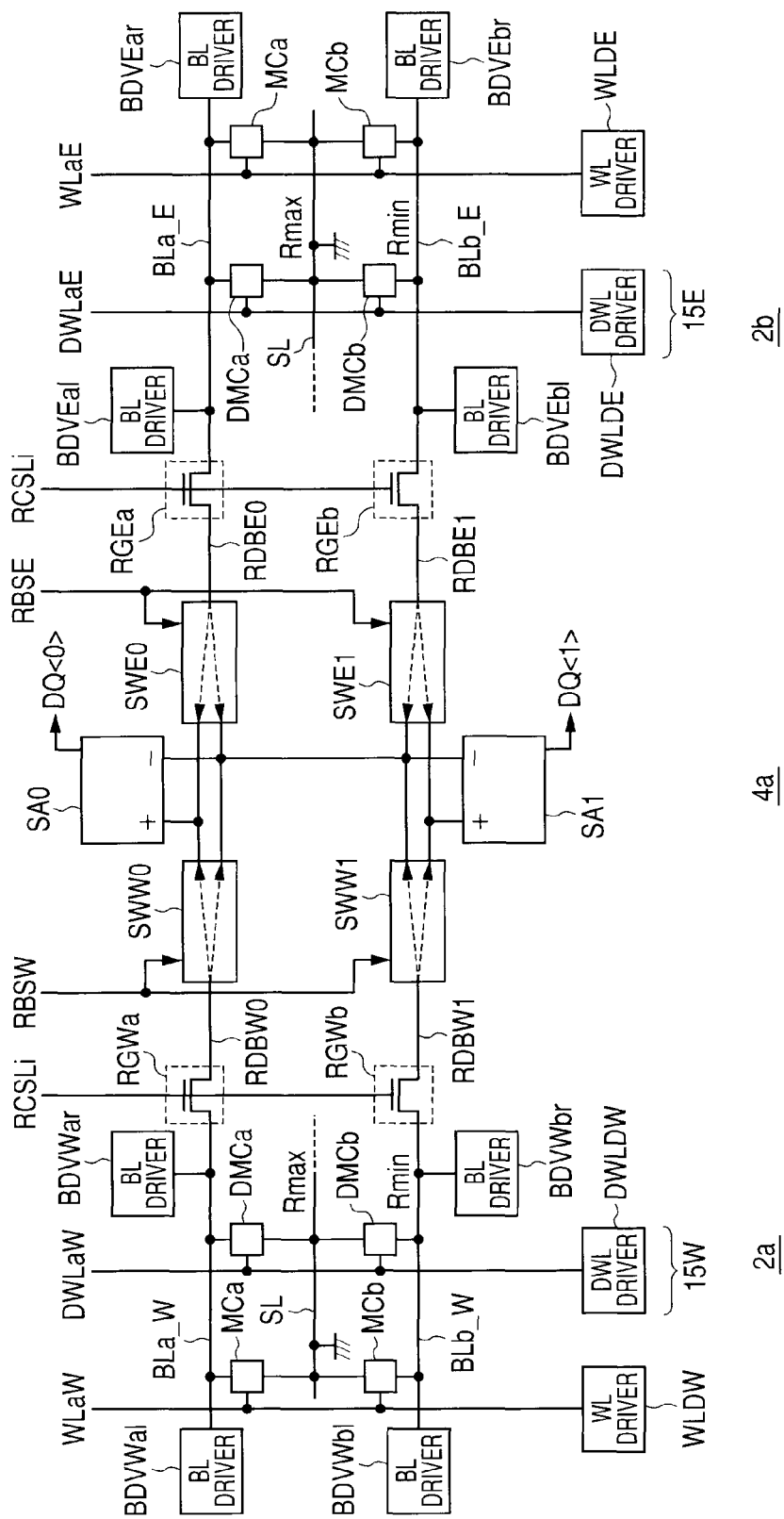
FIG. 3 is a diagram more concretely showing configurations of the memory subarrays and sense amplifier circuit shown in FIG. 2.

FIG. 3 is a diagram more concretely showing configurations of the sense amplifier circuit 4a and the memory subarrays 2a and 2b shown in FIG. 2. Configurations of parts related to the sense amplifiers SA0 and SA1 contained in the sense amplifier circuit 4a are typically shown in FIG. 3.

In the memory subarray 2a, bit lines BLa_W, . . . , BLb_W are respectively disposed corresponding to the memory cell columns. A memory cell MCa and a reference cell DMCa are coupled to the bit line BLa_W. A memory cell MCb and a reference cell DMCb are coupled to the bit line BLb_W. The reference cell DMCa is placed in a high resistance state and has a resistance value Rmax. The reference cell DMCb is placed in a low resistance state and has a resistance value Rmin.

In the memory cells MCa and MCb, their resistance values are set corresponding to the stored data. A word line WLaW is disposed with respect to the memory cells MCa and MCb, and a dummy word line DWLaW is disposed with respect to the reference cells DMCa and DMCb. These word line WLaW and dummy word line DWLaW are respectively driven by a word line (WL) driver WLDW and a dummy word line driver (DWL driver) DWLDW.

Bit line (BL) drivers BDVWa1 and BDVWar are provided at both ends of the bit line BLa_W. Bit line (BL) drivers BDVWb1 and BDVWbr are provided at both ends of the bit line BLb_W. These bit line drivers BDVWa1, BDVWar, BDVWb1 and BDVWbr respectively cause write currents to flow through their corresponding bit lines depending on write data. The direction of each of the bit line write currents is set according to the logical value of the write data.

The bit lines BLa_W and BLb_W are respectively coupled to internal read data lines RDBW0 and RDBW1 via read gates RGWa and RGWb. These read gates RGWa and RGWb are selectively brought into conduction in accordance with a read column selection signal RCSLi. The read column selection signal RCSLi is commonly given to the read gates provided for a plurality of bit lines because of plural-bit parallel reading. The internal read data lines RDBW0 and RDBW1 are respectively provided with a plurality of read gates. At one of the corresponding plural pairs of read gates, one bit line is selected by the corresponding read column selection signal RCSL (RCSLi: where i is set according to the number of bit lines contained in one pair of bit lines).

Switch circuits SWW0 and SWW1 are respectively provided between the internal read data lines RDBW0 and RDBW1 and the sense amplifiers SA0 and SA1. These switch circuits SWW0 and SWW1 couple the internal read data lines RDBW0 and RDBW1 to either of positive inputs (+) and negative inputs (−) of their corresponding sense amplifiers SA0 and SA1 in accordance with a read block selection signal RBSW.

Likewise also in the case of the memory subarray 2b, memory cells MCa and MCb and reference cells DMCa and DMCb are provided. The memory cell MCa and the reference cell DMCa are coupled to a bit line BLa_E, and the memory cell MCb and the reference cell DMCb are coupled to a bit line BLb_E. The memory cells MCa and MCb are coupled to a word line WLaE, and the reference cells DMCa and DMCb are coupled to a dummy word line DWLaE. These word line WLaE and dummy word line DWLaE are respectively driven to a selected state by a word line (WL) driver WLDE and a dummy word line driver (DWL driver) DWLDE.

Bit line drivers BDVEa1 and BDVEb1 and bit line drivers BDVEar and BDVEbr are provided on both sides of the bit lines BLa_E and BLb_E.

The bit lines BLa_E and BLb_E are respectively coupled to internal read data lines RDBE0 and RDBE1 via read gates RGEa and RGEb. The read gates RGEa and RGEb are also selectively brought into conduction in accordance with a read column selection signal RCSLi.

Switch circuits SWE0 and SWE1 are provided for the internal read data lines RDBE0 and RDBE1. The switch circuit SWE0 couples the internal read data line RDBE0 to one of the positive and negative inputs of the sense amplifier SA0 in accordance with a read block selection signal RBSE. The switch circuit SWE1 couples the internal read data line RDBE1 to one of the positive and negative inputs of the sense amplifier SA1 in accordance with the read block selection signal RBSE.

At these memory subarrays 2a and 2b, their reference cells are disposed in the central dummy cell areas 15W and 15E. The resistance value of each reference cell is set accurately.

Upon the data reading, the corresponding memory cells MC are selected at one of the memory subarrays 2a and 2b. Now assume where the memory cells MCa and MCb are selected at the memory subarray 2a. In this case, the dummy word line WLaE is driven to the selected state at the memory subarray 2b and hence the reference cells DMCa and DMCb are selected. The read gates RGWa and RGWb and RGEa and RGEb are brought into conduction in accordance with the read block selection signals RBSW and RBSE, so that the bit lines BLa_W and BLb_W are respectively coupled to the switch circuits SWW0 and SWW1, and the bit lines BLa_E and BLb_E are respectively coupled to the switch circuits SWE0 and SWE1.

Since the memory cells MCa and MCb of the memory subarray 2a are selected, the internal read data lines RDBW0 and RDBW1 are respectively coupled to the positive inputs of the sense amplifiers SA0 and SA1 via the switch circuits SWW0 and SWW1 in accordance with the read block selection signal RBSW. On the other hand, the switch circuits SWE0 and SWE1 respectively couple the internal read data lines RDBE0 and RDBE1 to the negative inputs of the sense amplifiers SA0 and SA1 in accordance with the read block selection signal RBSE. The negative inputs of these sense amplifiers SA0 and SA1 are coupled in common. Thus, the reference cells DMCa and DMCb are respectively supplied with read currents from the sense amplifiers SA0 and SA1 via the internal read data lines RDBE0 and RDBE1. Reference cell currents I (Rmax) and I (Rmin) flow through these reference cells DMCa and DMCb respectively.

Since the reference cells DMCa and DMCb are respectively supplied with the currents from both of the sense amplifiers SA0 and SA1, the current supplied from the negative input of each of the sense amplifiers SA0 and SA1 corresponds to an average value of the reference cell currents I (Rmax) and I (Rmin), i.e., (I(Rmax)+I (Rmin))/2. On the other hand, the cell current of the memory cell MCa flows through the bit line BLa_W. Similarly, the cell current corresponding to the stored data of the memory cell MCb flows through the internal read data line RDBW1 and the bit line BLb_W. These memory cells MCa and MCb are respectively placed in a high or low resistance state depending on the stored data. The stored data of the memory cells MCa and MCb are read by referring to the average of the cell current I (Rmax) placed in the high resistance state and the cell current I (Rmin) placed in the low resistance value, both of which flow into the negative inputs of the sense amplifiers SA0 and SA1, thereby generating internal read data DQ<0> and DQ<1>. Namely, the average current and each cell current are differential-amplified to generate the internal read data.

In this case, there is a need to accurately set the resistance values of the reference cells DMCa and DMCb to resistance values corresponding to the high resistance state and the low resistance state respectively with a view toward reading accurate data and ensuring a sufficient read margin. Disposing these reference cells DMCa and DMCb in the central parts of the memory subarrays 2a and 2b makes it possible to suppress the influence of shifts at patterning where they are disposed in an array peripheral portion and to generate an accurate reference current to perform the reading of data.

At the memory subarrays 2a and 2b, the source lines SL are respectively provided in common to the memory cells MCa and MCb. The source lines SL assume such a configuration that they are disposed in so-called mesh form. The floating-up or rising of potential of the source line SL where each of the memory cell current and the reference cell current flows can hence be suppressed, and accurate current detection can be performed.

Figure 4:
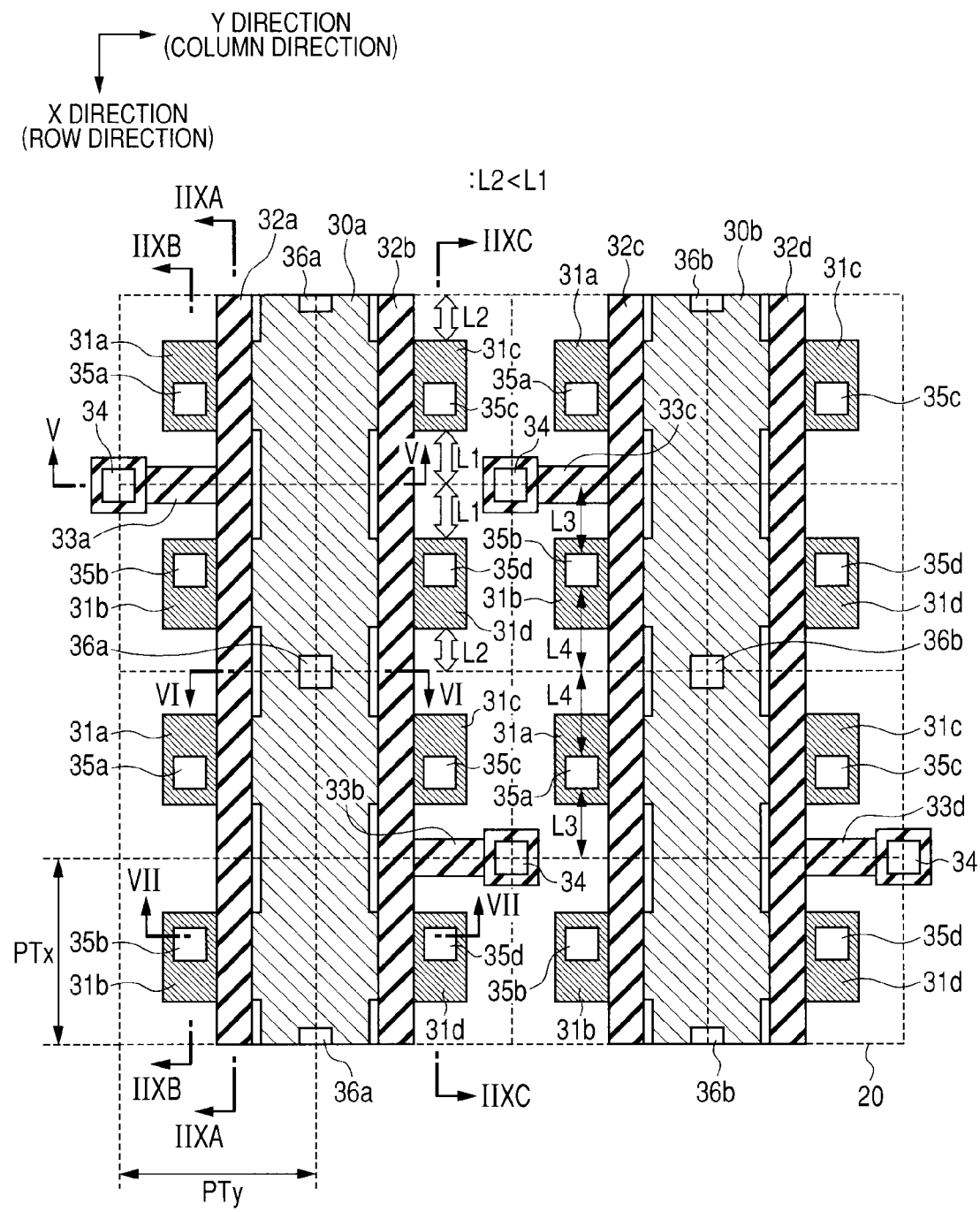
FIG. 4 is a diagram schematically illustrating a plane layout of a memory subarray according to the first embodiment of the present invention.

FIG. 4 is a diagram schematically showing a plane layout of memory cells of a memory subarray. Since the memory cells and reference cells have the same layout in the memory subarray, a plane layout of memory cells arranged in 4 rows and 4 columns is simply schematically shown in FIG. 4. The memory subarray is configured by repeatedly disposing the memory cells arranged in 4 rows and 4 columns shown in FIG. 4 in the X and Y directions.

Memory cell forming regions 20 are respectively assigned to the memory cells and the reference cells. The memory cell forming region 20 has a pitch PTx along the X direction and a pitch Pty along the Y direction. A one-bit memory cell is formed in the corresponding memory cell forming region 20. In FIG. 4, the pitches PTx and Pty of the memory cell forming region 20 are shown to be approximately equal to each other.

Active regions (impurity regions) 30a and 30b are respectively formed so as to extend continuously in the X direction. The active regions 30a and 30b configure source diffusion wirings (impurity regions) and are provided in common to the memory cells arranged in two rows. At the respective memory cell forming regions, drain impurity regions 31a, 31b, 31c and 31d are disposed opposite to the source impurity regions 30a and 30b with respect to the Y direction with being shifted from the central positions of the memory cell forming regions 20 with respect to the X direction. The drain impurity regions 31a and 31b are disposed mirror-symmetrically with respect to the boundaries of the memory cell forming regions as viewed in the X direction. Similarly, the drain impurity regions 31c and 31d are also disposed mirror-symmetrically with respect to the boundary regions between the memory cell forming regions as viewed in the X direction. Likewise, the drain impurity regions 31a and 31c are disposed mirror-symmetrically with respect to the boundary regions between the memory cell forming regions also in the Y direction. Similarly as well, the drain impurity regions 31b and 31d are also disposed mirror-symmetrically with respect to the boundary regions therebetween.

A gate word line 32a comprised of, for example, polysilicon is disposed in a region between the source impurity region 30a and the drain impurity regions 31a and 31b so as to extend continuously in the X direction. A gate word line 32b is disposed between the source impurity region 30a and the drain impurity regions 31c and 31d so as to extend continuously in the X direction. Similarly, also as to the source impurity region 30b, gate word lines 32c and 32d, which extend continuously in the X direction, are disposed on both sides thereof.

The gate word lines 32a, 32b, 32c and 32d respectively have, at predetermined intervals as viewed in the X direction, protrusions 33a, 33b, 33c and 33d each of which extends to the boundary of the memory cell forming region 20 in the Y direction. The protrusions 33a, 33b, 33c and 33d are disposed every 4-bit memory cells in the X direction. The gate word lines (gate word lines 32a and 32b, for example) adjacent in the Y direction are disposed with being shifted by the memory cells of 2 bits.

The protrusions 33a and 33b of the gate word lines 32a and 32b provided with respect to the same source impurity region 30a are disposed in the directions opposite to each other. The protrusions 33c and 33d provided with respect to the gate word lines 32c and 32d of the source impurity region 30b are also disposed in the opposite direction. The protrusions 33a and 33c of the gate word lines 32a and 32c provided every other line in the gate word lines are provided at the same position. The protrusions 33b and 33d are provided at the same position as viewed in the X direction. By placing the protrusions 33b and 33d in different positions in the X direction, the word line protrusions can be disposed with sufficient margins.

Source contacts 36a and 36b are respectively provided in the source impurity regions 30a and 30b. The source contacts 36a and 36b are respectively disposed every 2-bit memory cells in the X direction. Drain contacts 35a, 35b, 35c and 35d are respectively provided also in the drain impurity regions 31a through 31d. The drain contacts 35a through 35d are disposed mirror-symmetrically in the X and Y directions with respect to the boundary regions of the memory cell forming regions. The protrusions 33a through 33d are respectively provided with shunt contacts 34. Each of the protrusions 33a through 33d is electrically coupled to an upper layer metal wiring to be described later via the shunt contact 34. The shunt contact 34 configures part of each shunt line 11 shown in FIG. 2.

The contacts 35a through 35d relative to the drain impurity regions are electrically coupled to their corresponding variable resistive elements formed in a layer thereabove.

The drain impurity regions 31a through 31d are respectively placed in positions shifted from the X-direction central regions of the corresponding memory cell forming regions 20. Namely, the distances from the ends of the drain impurity regions along the X direction to the boundary regions of the memory cell forming regions 20 are respectively L1 and L2 and satisfy the relationship of L1>L2. The drain contacts 35a through 35d are disposed mirror-symmetrically with respect to the boundary regions of the memory cell forming regions 20. Thus, the distances between the drain impurity regions of the memory cells adjacent in the X direction are alternately brought to 2·L1 and 2·L2. The relationship of the distance between the drain impurity regions is repeated along the X direction. Disposing the protrusions 33a and 33b of the gate word lines in the regions in which the distances defined between the drain impurity regions are 2·L1 makes it possible to dispose the protrusions 33a through 33d with sufficient margins.

By extending the protrusions 33a through 33d to the Y-direction boundary regions of the memory cell forming regions 20, the distance between each of the drain contacts 35a through 35d and its corresponding shunt contact 34 can be made sufficiently large. Thus, even if positions displacements or pattern shifts (pattern failures) in the protrusions at their patterning occur, it is possible to avoid the occurrence of failures such as overlapping of the drain impurity regions and the protrusions, the contact of the protrusions with the drain contacts, etc. The shunt contacts 34 and the drain contacts 35*a* through 35*d* can also be laid out with sufficient margins upon memory cell miniaturization.

It is also possible to provide word line shunt regions in the memory cell forming regions and suppress an increase in the area of the memory array.

The drain contacts 35*a* through 35*d* are disposed mirror-symmetrically with respect to the boundaries of the memory cell forming regions along the X direction. Thus, the distances in the X direction between the drain contacts 35*b* and 35*a* can be made wide enough in regions corresponding to regions for forming the source contacts 36*a* and 36*b*. Namely, the drain contact 35*b* is disposed with being shifted from the central part of the memory cell forming region. A distance L4 from the drain contact 35*b* and the boundary of the memory cell forming region 20 can be made enough for more than a distance L3 up to the boundary of the memory cell forming region in which the word line protrusion is formed. Accordingly, metal source lines each comprised of a metal wiring can be disposed in regions in which the distance between the drain contacts is 2·L4. The width of each upper metal source line electrically coupled to each of the source line contacts 36*a* and 36*b* can be made wide enough, and the resistance of each source line can hence be reduced sufficiently.

Figure 5:
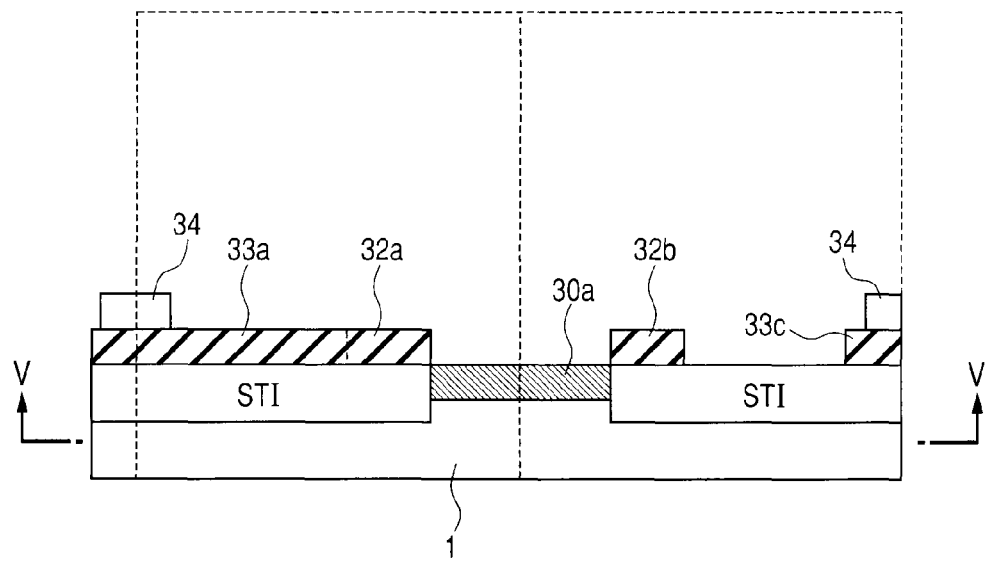
FIG. 5 is a diagram schematically showing a sectional structure taken along line V-V shown in FIG. 4.

FIG. 5 is a diagram schematically showing a sectional structure taken along line V-V shown in FIG. 4. A sectional structure of two memory cell forming regions (indicated by broken lines) is shown in FIG. 5. In FIG. 5, a memory cell is formed over a semiconductor substrate area or region 1, and adjacent memory cells are separated from each other by shallow trench isolation regions STI comprised of, for example, a shallow trench isolation film. Incidentally, since the memory cell is formed over the semiconductor substrate region 1 and the adjacent memory cells are separated by the shallow trench isolation regions STI, reference numbers for these semiconductor substrate region and shallow trench isolation regions are shown in the following description and their explanations will therefore be omitted appropriately.

The source impurity region 30*a* is disposed in the boundary region of the central memory cell. The gate word lines 32*a* and 33*a* are disposed in a layer above the source impurity region 30*a*. With respect to the gate word line 32*a*, the protrusion 33*a* is disposed so as to extend to the memory cell boundary region using the corresponding wiring of the same layer. Equivalently, the gate word line extends to the memory cell boundary region. The shunt contact 34 is provided at the end (the boundary of the memory cell forming region) of the protrusion 33*a*. The protrusion 33*c* of the memory cell separated from the gate word line 32*b* and adjacent in the Y direction is disposed over the shallow trench isolation region STI. The shunt contact 34 is disposed over the protrusion 33*c*. As shown in FIG. 4, one shunt contact 34 is merely placed in the boundary of the memory cell forming region extending in the Y direction. Namely, one shunt contact 34 is merely disposed with respect to the memory cells for the two rows, and the shunt contact 34 can be disposed with a sufficient margin.

Figure 6:
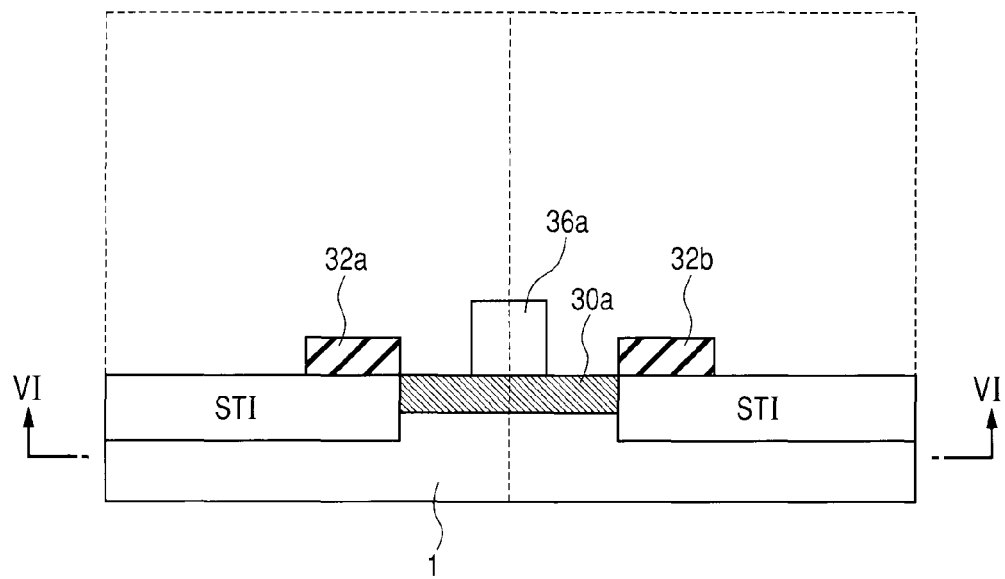
FIG. 6 is a diagram schematically depicting a sectional structure taken along line VI-VI shown in FIG. 4.

FIG. 6 is a diagram schematically showing a sectional structure taken along line VI-VI shown in FIG. 4. A sectional structure of the two memory cell forming regions (indicated by broken lines) is shown also in FIG. 6. In FIG. 6, the source line contact 36*a* is disposed in the center of the source impurity region 30*a*. The gate word lines 32*a* and 32*b* are disposed in their corresponding upper layers on both sides of the source impurity region 30*a*. Also in the regions, the gate word lines 32*a* and 32*b* are merely provided on both sides of the source impurity region 30*a*, and hence the source line contact 36*a* can be disposed with a sufficient margin. Incidentally, also in the structure shown in FIG. 6, shallow trench isolation regions STI are disposed on both sides of the source impurity region 30*a* over the semiconductor substrate region 1 and separated from the adjacent memory cells.

Figure 7:
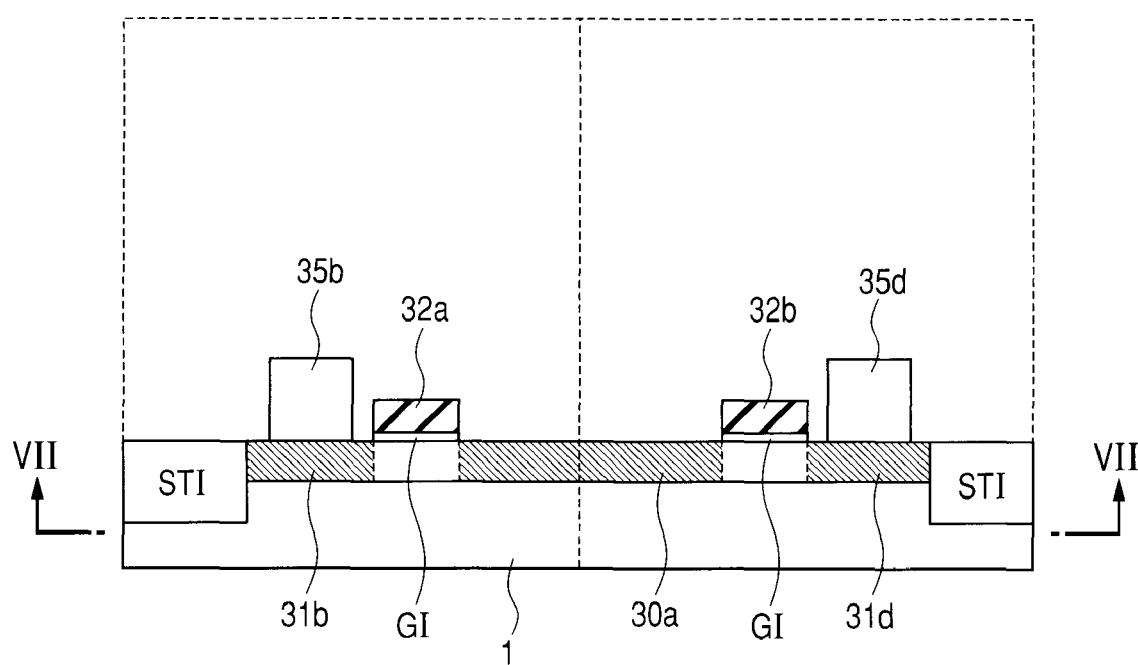
FIG. 7 is a diagram schematically showing a sectional structure taken along line VII-VII shown in FIG. 4.

FIG. 7 is a diagram schematically showing a sectional structure of two memory cell forming regions, which is taken along line VII-VII shown in FIG. 4. In the regions, the drain impurity regions 31*b* and 31*d* are respectively disposed opposite to each other on both sides of the source impurity region 30*a*. Shallow trench isolation regions STI are disposed adjacent to the drain impurity regions 31*b* and 31*d* respectively. The gate word line 32*a* is formed via a gate insulator GI over a region defined between the source impurity region 30*a* and the drain impurity region 31*b*. The gate word line 32*b* is disposed via a gate insulator GI over a region defined between the source impurity region 30*a* and the drain impurity region 31*d*. The drain contacts 35*b* and 35*d* are respectively provided over the drain impurity regions 31*b* and 31*d*.

Channels are normally formed below the gate word lines 32*a* and 32*b* when each access transistor is brought into conduction. An impurity is implanted below the gate word lines 32*a* and 32*b* for adjustments to the threshold voltage and the like. In the following description, the term "active region" is used as one indicative of an impurity-implanted region including the source impurity region 30*a*, drain impurity regions 31*b* and 31*d* and channel forming regions (regions below the gate word lines).

As shown in these FIGS. 5 and 7, the shunt contacts 34 for realizing a word line piling structure can be disposed in the memory cell forming regions. The word line piling structure can be implemented without the need to provide special word line shunt regions and increasing the layout area of each memory cell, thus making it possible to suppress an increase in the layout area of the array.

FIGS. 8(A), 8(B) and 8(C) are respectively diagrams schematically showing sectional structures of memory cell structures taken when the memory cell structures are seen in drain region directions along line IIXA-IIXA, line IIXB-IIXB and line IIXC-IIXC shown in FIG. 4. The gate word line 32*a* is disposed in FIG. 8(A). A plurality of channel regions are disposed below the gate word line 32*a* with being spaced from one another. Shallow trench isolation regions STI are disposed so as to interpose these channel regions therebetween. The channel regions are separated from one another by the shallow trench isolation regions STI. A gate insulator GI is disposed between each of the channel regions and the gate word line 32*a*.

The widths of the shallow trench isolation regions STI are distances 2·L1 and 2·L2 set alternately. Namely, the widths of the shallow trench isolation regions STI (1) and STI (3) correspond to 2·L1, and the width of the shallow trench isolation region STI (2) corresponds to 2·L2.

As shown in FIG. 8(B), the drain contacts 35*a* and 35*b* are respectively provided for the drain impurity regions 31*a* and 31*b* in regions separated from the word line 32*a* shown in FIG. 8(A). The protrusion 33*a* is disposed over its corresponding shallow trench isolation region STI lying between the drain contacts 35*a* (1) and 35*b* (2).

The distances between these drain contacts 35*a* and 35*b* are 2·L3 and 2·L4 set alternately. The drain contacts are disposed mirror-symmetrically with respect to the boundary of each memory cell forming region. Namely, the distance between the drain contacts 35*a* (1) and 35*b* (2) is 2·L3, and the distance between the drain contacts 35*b* (2) and 35*a* (3) is 2·L4. The distance between the drain contacts 35*a* (3) and 35*b* (4) is 2·L3. In regions in which the distance between the drain impurity regions is 2·L1 and the distance between the drain contacts is 2·L3, the shunt contact 34 is provided with respect to the protrusion 33a.

Thus, the distance between the drain impurity regions 31a and 31b that interpose the protrusion 33a coupled to the shunt contact 34 therebetween is sufficiently wide like 2·L1. The word gate line protrusion can be accurately disposed with a sufficient margin in avoidance of overlapping thereof with the drain impurity region, etc.

In FIG. 8(C), the drain impurity regions 31c and 31d are alternately placed. Also in this placement, the distances of 2·L1 and 2·L2 are alternately set as for the distance between the drain impurity regions 31c and 31d.

The drain contacts 35c and 35d are respectively provided with respect to these drain impurity regions 31c and 31d. The shunt contact 34 is provided via the protrusion 33b of the gate word line 32b. The shunt contact 34 corresponds to the region in which the distance between the drain impurity regions is set as an interval of 2·L1. The shunt contacts 34 relative to the gate word lines 32a and 32b are placed in different positions as shown substantially in registration form in FIGS. 8(B) and 8(C) to thereby make it possible to avoid the occurrence of crosstalk between the corresponding word lines via their protrusions and shunt contacts 34.

Figure 9:
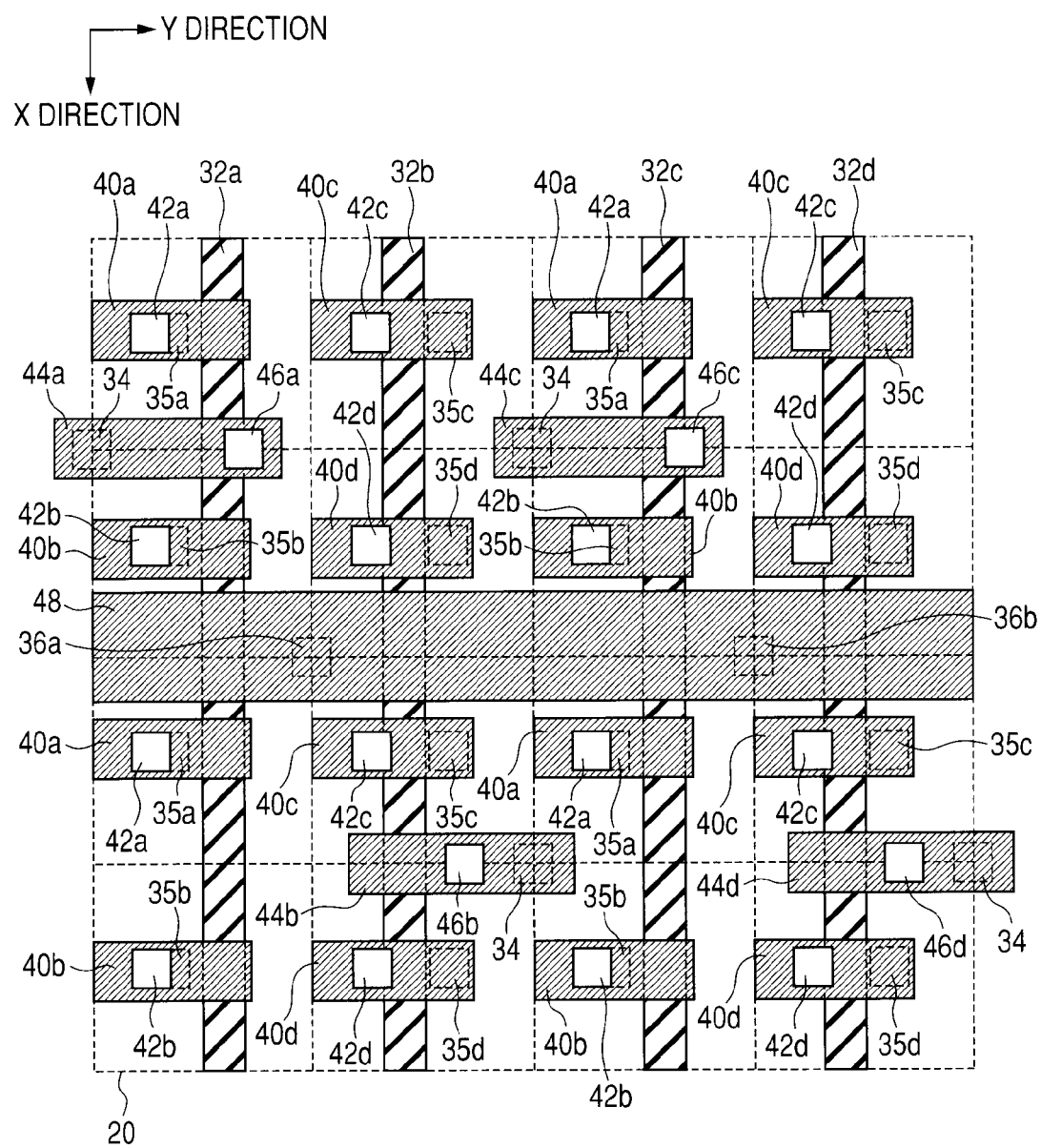
FIG. 9 is a diagram schematically illustrating a layout of upper layer wirings in the plane layout shown in FIG. 4.

FIG. 9 is a diagram schematically showing a layout of upper first metal wirings in the plane layout shown in FIG. 4. The gate word lines 32a through 32d, the drain contacts 35a through 35d and the shunt contacts 34 are shown in FIG. 9 together.

In FIG. 9, first intermediate wirings 40a through 40d each formed of the first metal wiring are respectively disposed corresponding to the drain contacts 35a through 35d. The first intermediate wirings 40a and 40b are disposed alternately along the X direction, and the first intermediate wirings 40c and 40d are disposed alternately along the X direction. The first intermediate wirings 40a and 40c are disposed alternately in the Y direction. Further, the first intermediate wirings 40b and 40d are disposed alternately in the Y direction.

The first intermediate wirings 40a through 40d respectively have a rectangular shape long in the Y direction and are disposed so as to cross the corresponding gate word lines 32a and 32b from the boundaries of the memory cell forming regions 20. The first intermediate wirings 40a through 40d configure parts of intermediate plugs for electrical coupling to variable magnetoresistive elements formed in an upper layer. The drain impurity regions 31a through 31d of the access transistors are electrically coupled to their corresponding variable magnetoresistive elements via the corresponding drain contacts 35a through 35d.

The first intermediate wirings 40a through 40d are disposed translation-symmetrically along the X and Y directions to lay out them in closest-packed form and disposed repeatedly in the same pattern. Thus, these first intermediate wirings 40a through 40d are disposed substantially in the central regions of the memory cell forming regions 20.

First vias 42a through 42d are respectively provided corresponding to the drain contacts 35a through 35d with respect to the first intermediate wirings 40a through 40d for their coupling to upper layer wirings. The first vias 42a through 42d are arranged substantially in line along the X and Y directions. The first vias 42a and 42b are alternately disposed in the X direction, and the first vias 42c and 42d are alternately disposed in the X direction. The first vias 42a and 42c are alternately disposed in the Y direction, and the first vias 42b and 42d are alternately disposed in the Y direction.

The first intermediate wirings 44a and 44c are respectively arranged in line along the Y direction between the first intermediate wirings 40a and 40b in association with the gate word lines 32a and 32c. The first intermediate wirings 44b and 44d are arranged in line in the Y direction so as to correspond to the shunt contacts 34 with respect to the word lines 32b and 32d. These first intermediate wirings 44a through 44d are intermediate wirings for realizing a word line shunt structure and are disposed so as to extend from the corresponding shunt contacts 34 to over the corresponding gate word lines 32a through 32d.

At the adjacent columns, the shunt contacts 34 are disposed at distances of two memory cells. At the same row, the shunt contacts 34 are disposed every two rows. Thus, the intermediate wirings 44a through 44d are also disposed with pitches similar to the shunt contacts 34.

First vias 46a and 46c are provided at layers above their corresponding gate word lines 32a and 32c with respect to the shunt first intermediate wirings 44a and 44c. First vias 46b and 46d are disposed at layers above their corresponding gate word lines 32b and 32d also with respect to the first intermediate wirings 44b and 44d. The shunt intermediate wirings 44a through 44d are also disposed translation-symmetrically with respect to the Y direction.

A metal source line 48 formed of a first metal wiring, which extends continuously in the Y direction, is disposed corresponding to the source line contacts 36a and 36b. The metal source line 48 is electrically coupled to a lower source impurity region (not shown in FIG. 9) via the source line contacts 36a and 36b.

The first via 46a for word line shunt is disposed in a zigzag manner with respect to the drain-coupling first vias 42a and 42b. The first vias 46b through 46d relative to the first intermediate wirings 44b through 44d for other word line contacts are also disposed in a zigzag manner with respect to the drain-coupling first vias 42a through 42d. Thus, the distance between the first vias can be taken sufficiently. Since the distance between the drain contacts of each adjacent pair in the X direction, of the drain contacts 35a through 35d is large sufficiently even if the distance between the drain impurity regions is narrow, the metal source line 48 can be disposed with a sufficient width. Thus, the metal source line 48 low in resistance can be laid out. The first intermediate wirings 44a through 44d are respectively disposed at the boundaries of the memory cell forming regions 20 in the X direction. Each of the drain-coupling first intermediate lines 40a through 40d is placed in the center in the X direction, of the memory cell forming region 20. The word shunt first intermediate wirings 44a through 44d can be disposed with sufficient margins in association with the gate word line protrusions.

The drain contacts 35a and 35b located on both sides of the source contact 36a as viewed in the X direction are disposed with being shifted in the direction of being spaced away from the source line contact 36a with respect to the centers of the drain impurity regions 31a and 31b, thereby making it possible to make broader the width of the metal source line 48 formed in the same layer as the first intermediate wirings 40a and 40b to reduce the resistance.

Figure 10:
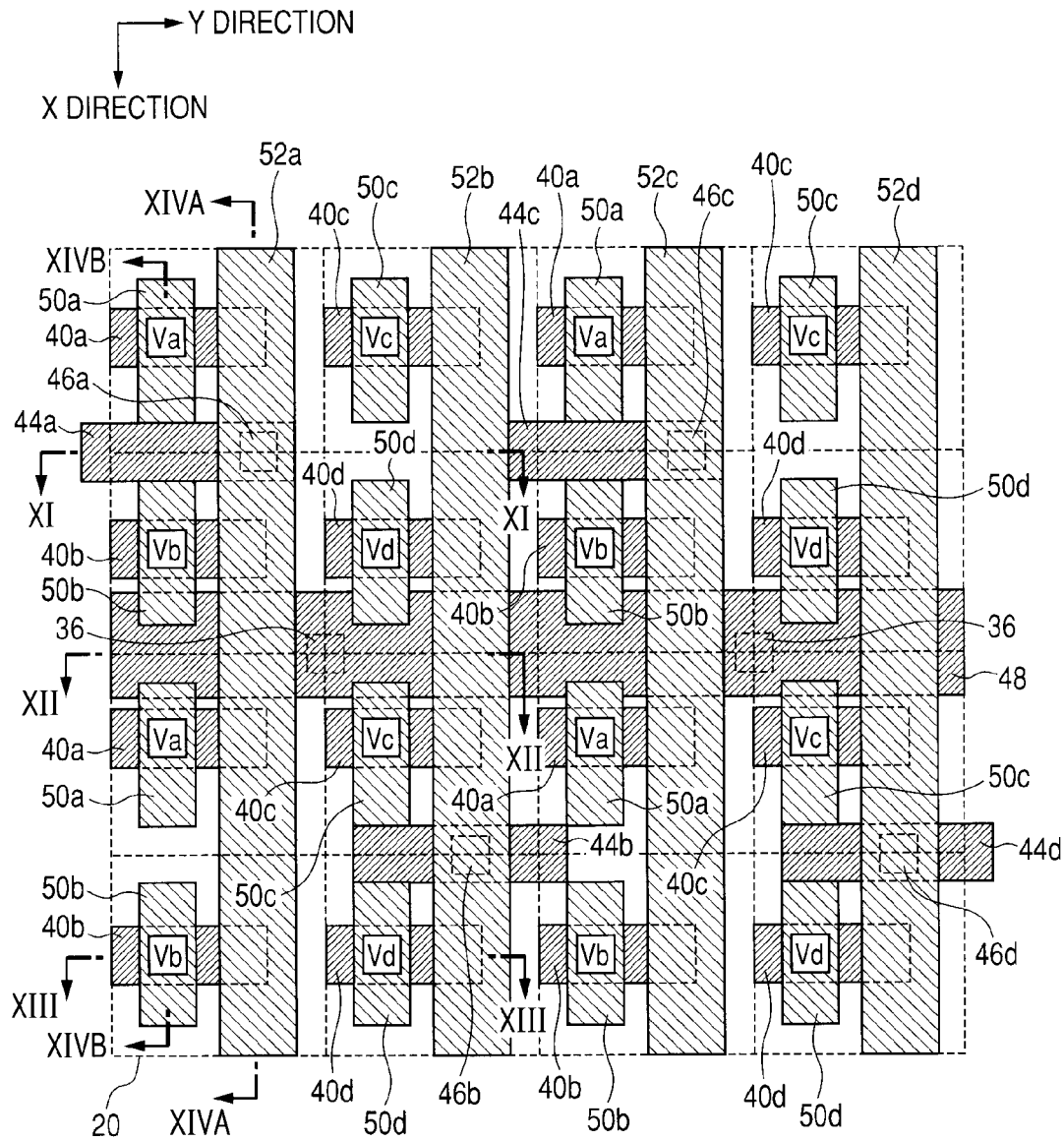
FIG. 10 is a diagram schematically showing a layout of wirings for upper layers in the plane layout shown in FIG. 9.

FIG. 10 is a diagram showing a plane layout of second metal wirings for upper layers in the plane layout shown in FIG. 9 together with a layout of second vias. In FIG. 10, second intermediate wirings 50a through 50d each configured by a second metal wiring in a rectangular form long in the X direction are respectively disposed in association with one another so as to cross the first intermediate wirings 40a through 40d. At these second intermediate wirings 50a through 50d, the second intermediate wirings 50a and 50b are alternately disposed along the X direction, and the second intermediate wirings 50*c* and 50*d* are alternately disposed along the X direction.

Second metal wirings (metal word lines) 52*a* through 52*d* are disposed so as to continuously extend in the X direction over the first vias 46*a* through 46*d* provided in the shunt first intermediate wirings 44*a* through 44*d* shown in FIG. 9 and to correspond to the unillustrated gate word lines. These second metal wirings 52*a* through 52*d* are respectively coupled to the lower first intermediate wirings 44*a* through 44*d* via the first vias 46*a* through 46*d*. The first intermediate wirings 44*a* through 44*d* are coupled to their corresponding gate word lines via the shunt contacts 34 shown in FIG. 9. Thus, these second metal wirings 52*a* through 52*d* are coupled to their corresponding gate word lines located therebelow. Consequently, a word line hierarchical structure in which the word lines comprise the gate word lines and the metal word lines, is realized, and the word lines low in resistance are implemented.

These second metal wirings 52*a* through 52*d* are metal wirings located at the layers above the first intermediate wirings 44*a* through 44*d*. Thus, even when the shunt first intermediate wirings 44*a* through 44*d* extend to the boundaries of the memory cell forming regions along the Y direction, these shunt first intermediate wirings 44*a* through 44*d* do not have any adverse effect on the layout of the second metal wirings 52*a* through 52*d*.

Figure 11:
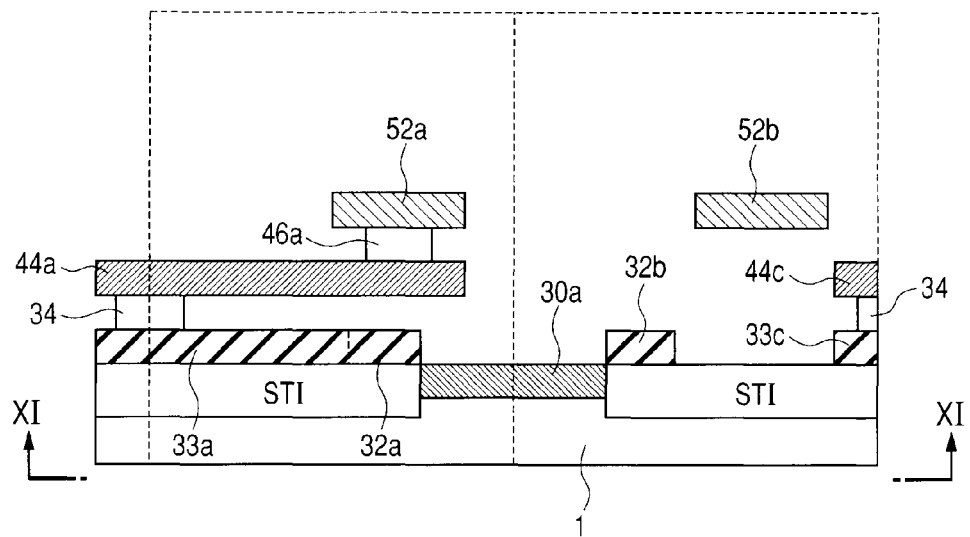
FIG. 11 is a diagram schematically illustrating a sectional structure taken along line XI-XI shown in FIG. 10.

FIG. 11 is a diagram schematically illustrating a sectional structure of two memory cell system cell regions, which is taken along line XI-XI of the plane layout shown in FIG. 10. The layout of the lower layer of the sectional structure shown in FIG. 5 is also shown together in FIG. 11. The gate word lines 32*a* and 32*b* are disposed at layers above both sides of the source impurity region 30*a*. The gate word line 32*a* extends to the boundary of each memory cell forming region via the protrusion 33*a*. The protrusion 33*a* is electrically coupled to its corresponding first intermediate wiring 44*a* via the shunt contact 34.

The first intermediate wiring 44*c* is electrically coupled also to its corresponding protrusion 33*c* of the adjacent memory cell via the shunt contact 34.

The first intermediate wiring 44*a* is electrically coupled to its corresponding second metal wiring 52*a* via a second via 46*a*. A hierarchical word line is configured by the second metal wiring 52*a*, the first intermediate wiring 44*a* comprised of the first metal wiring, the protrusion 33*a* and the gate word line 32*a*. The corresponding gate word line relatively high in resistance is electrically coupled to the second metal wiring 52*a* low in resistance so that the resistance is reduced equivalently. A second metal wiring 52*b* is similarly provided also with respect to the gate word line 32*b*.

Figure 12:
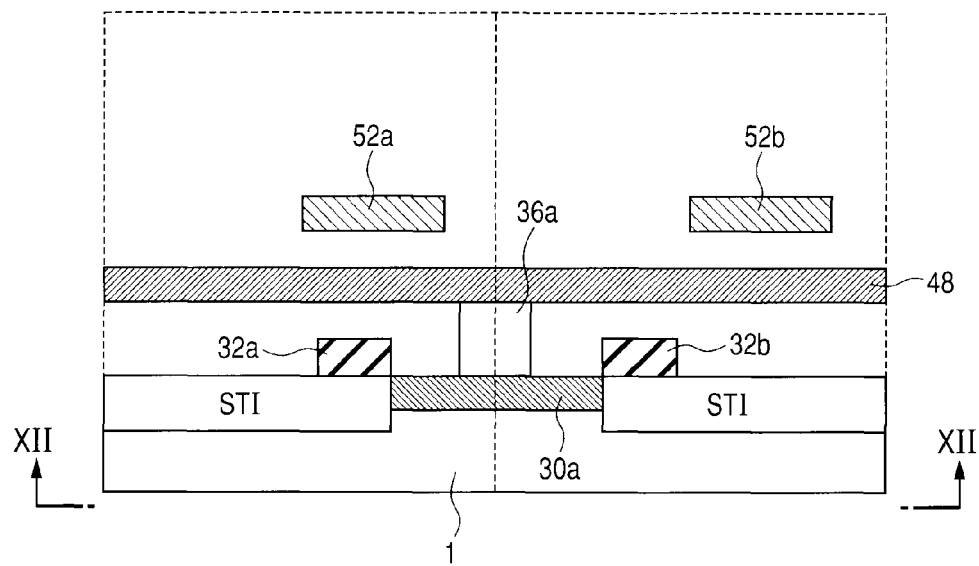
FIG. 12 is a diagram schematically showing a sectional structure taken along line XII-XII shown in FIG. 10.

FIG. 12 is a diagram schematically showing a sectional structure of two memory cell forming regions, which is taken along line XII-XII shown in FIG. 10. In FIG. 12, the metal source line 48 comprised of the first metal wiring extends continuously. The metal source line 48 is electrically coupled to its corresponding lower source impurity region 30*a* via the source line contact 36*a*. The second metal wirings 52*a* and 52*b* are provided so as to cross the metal source line 48. Underneath the metal source line 48, the gate word lines 32*a* and 32*b* are disposed at layers above both sides of the source impurity region 30*a*.

Figure 13:
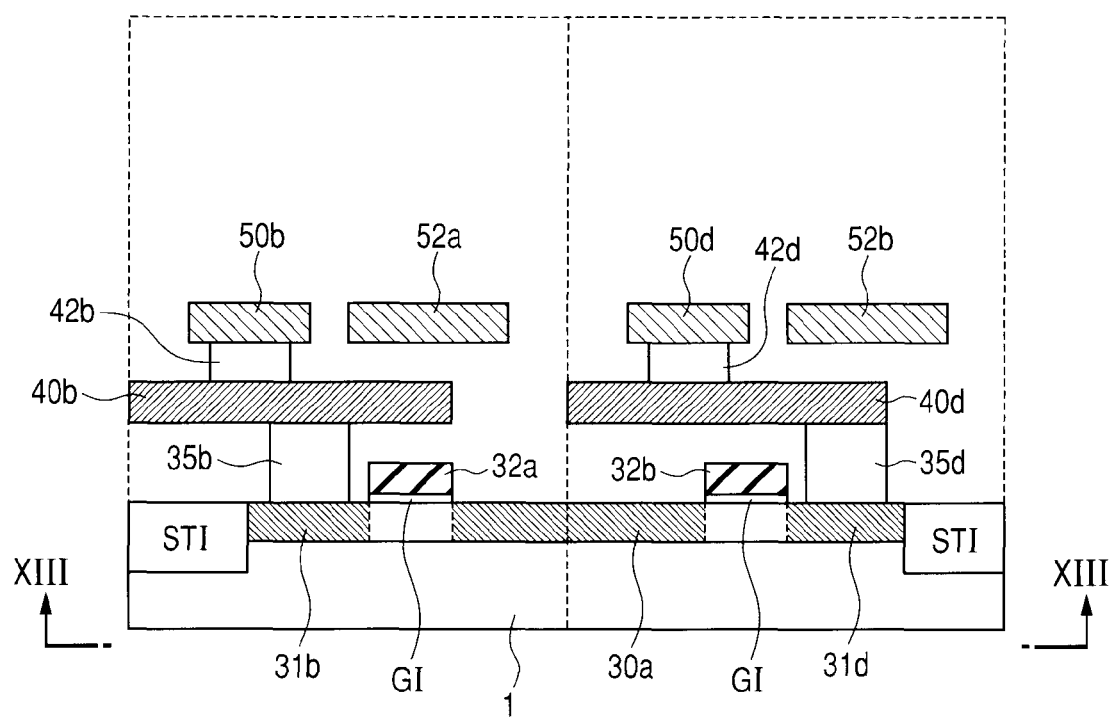
FIG. 13 is a diagram schematically depicting a sectional structure taken along line XIII-XIII shown in FIG. 10.

FIG. 13 is a diagram schematically depicting a sectional structure of two memory cell forming regions, which is taken along line XIII-XIII shown in FIG. 10. The sectional structure shown in FIG. 13 has a configuration in which second metal wirings are further disposed with respect to the sectional structure shown in FIG. 7. In FIG. 13, the same reference numerals are respectively attached to parts or components corresponding to those of the configuration shown in FIG. 7, and their detailed explanations will therefore be omitted.

At such regions, as shown in FIG. 13, the drain impurity regions 31*b* and 31*d* are electrically coupled to their corresponding first intermediate wirings 40*b* and 40*d* via the drain contacts 35*b* and 35*d*. The first intermediate wirings 40*b* and 40*d* are electrically coupled to their corresponding second intermediate wirings 50*b* and 50*d* via second vias 42*b* and 42*d*. The second metal wirings 52*a* and 52*b* are disposed adjacent to the second intermediate wirings 50*b* and 50*d*.

As shown in FIGS. 10 through 13, the second metal wirings and the second vias are also laid out translation-symmetrically and disposed repeatedly in the same patterns along the X and Y directions. Thus, the wirings can be disposed in a high density.

FIGS. 14(A) and 14(B) are respectively diagrams schematically showing sectional structures taken along line XIVA-XIVA and line XIVB-XIVA shown in FIG. 10. A sectional structure taken when a memory cell structure is seen toward the left side of the drawing along line XIVA-XIVA is typically shown in FIG. 14(A). A sectional structure taken when a memory structure is seen to the right side of the drawing along line XIVB-XIVB is shown in FIG. 14(B).

In FIG. 14(A), the shallow trench isolation regions STI and channel regions are alternately disposed at the surface of the semiconductor substrate region 1. The gate insulators GI are formed over the channel regions respectively. The gate word line 32*a* is continuously disposed over the gate insulators GI and the shallow trench isolation regions STI. The unillustrated drain impurity regions 31*a* and 31*b* are electrically coupled to their corresponding first intermediate wirings 40*a* and 40*b* by means of the unillustrated drain contacts 35*a* and 35*b*. The second metal wiring 52*a* that extends continuously is provided at an upper layer. The second metal wiring 52*a* is electrically coupled to the gate word line 32*a* via the unillustrated shunt contact 34, first intermediate wiring 44*a* and first via 46*a*.

In FIG. 14(B), the drain impurity regions 31*a* and 31*b* are alternately disposed in the surface of the semiconductor substrate region 1 and separated from each other by the shallow trench isolation regions STI. The drain impurity regions 31*a* and 31*b* are electrically coupled to their corresponding upper first intermediate wirings 40*a* and 40*b* by means of the drain contacts 35*a* and 35*b*. The metal source line 48 configured of the first metal wiring is disposed between the first intermediate wirings 40*b* and 40*a* at the central part thereof.

The first intermediate wirings 40*a* and 40*b* are coupled to their corresponding second intermediate wirings 50*a* and 50*b* each configured of the second metal wiring via the first vias 42*a* and 42*b*. On the other hand, the protrusions 33*a* are electrically coupled to the first metal wiring 44*a* via the unillustrated shunt contact 34.

The metal source line 48 is disposed in the region in which the distance between the drain contacts is 2·L4. The protrusion 33*a* and the first intermediate wiring and shunt contact 34 (not shown) for performing word line shunt are disposed in the region in which the interval or space between the drain impurity regions is 2·L3.

The second vias Va and Vb for electrical coupling to the upper layer wirings are provided at the second metal wirings 50*a* and 50*b* respectively.

In FIGS. 14(A) and 14(B), the respective regions as viewed in the X direction are brought approximately into registration with respect to the X direction. The shunt region in which the second metal wiring 52*a* is electrically coupled to its corresponding gate word line 32a is indicative of the region in which the distance between the drain impurity regions is 2·L1. The region in which the metal source line 48 is disposed is indicative of the region in which the distance between the drain contacts is 2·L4. Accordingly, each of the word line piling region and the source line piling region can be disposed within the memory cell forming region without providing specific regions.

Figure 15:
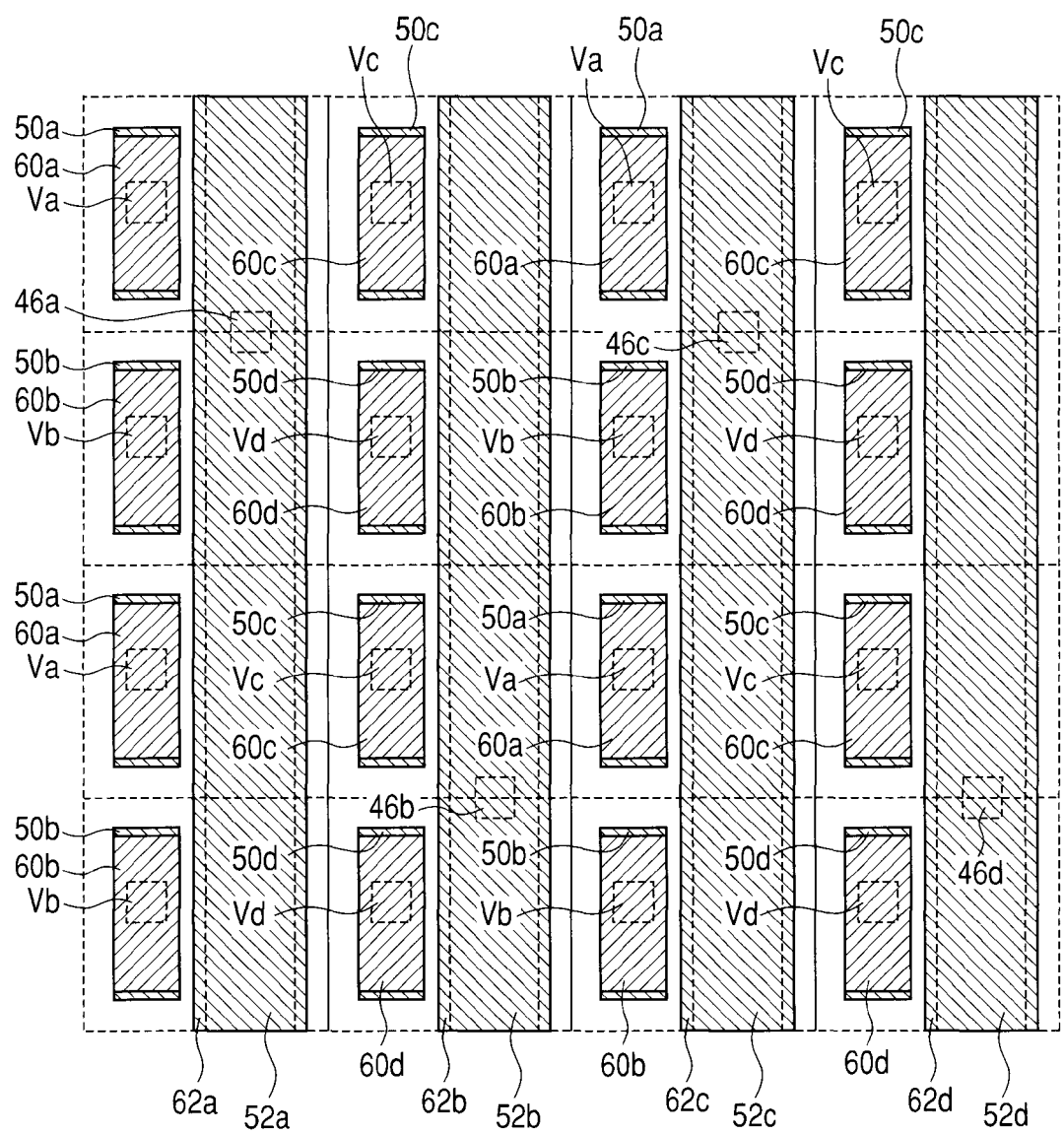
FIG. 15 is a diagram schematically showing a layout of upper layer wirings in the plane layout shown in FIG. 10.

FIG. 15 is a diagram schematically showing a plane layout of upper third metal wirings in the plane layout shown in FIG. 10. The layout of the second metal wirings is also shown together in FIG. 15.

In FIG. 15, third intermediate wirings 60a through 60d each comprised of the third metal wiring are disposed corresponding to the second intermediate wirings 50a through 50d so as to overlap with their corresponding second intermediate wirings. These third intermediate wirings 60a through 60d are electrically coupled to their corresponding second intermediate wirings 50a through 50d via the second vias Va through Vd.

Third metal wirings 62a through 62d are disposed so as to overlap with the second metal wirings 52a through 52d in association with the second metal wirings 52a through 52d. The third metal wirings 62a through 62d are brought into non-contact with the lower second metal wirings 52a through 52d. While second vias 46a through 46d for word-line contact are respectively disposed at predetermined intervals, they are provided to make electrical coupling between the second metal wirings 52a through 52d and the lower first intermediate wirings (50a through 50d).

Disposing the third metal wirings 62a through 62d so as to overlap with the second metal wirings 52a through 52d makes uniform a layout step between each of the upper variable magnetoresistive elements and its corresponding write word line (digit line). Also the MRAM cell is formed in the same manufacturing process as that of an unillustrated processor.

Figure 16:
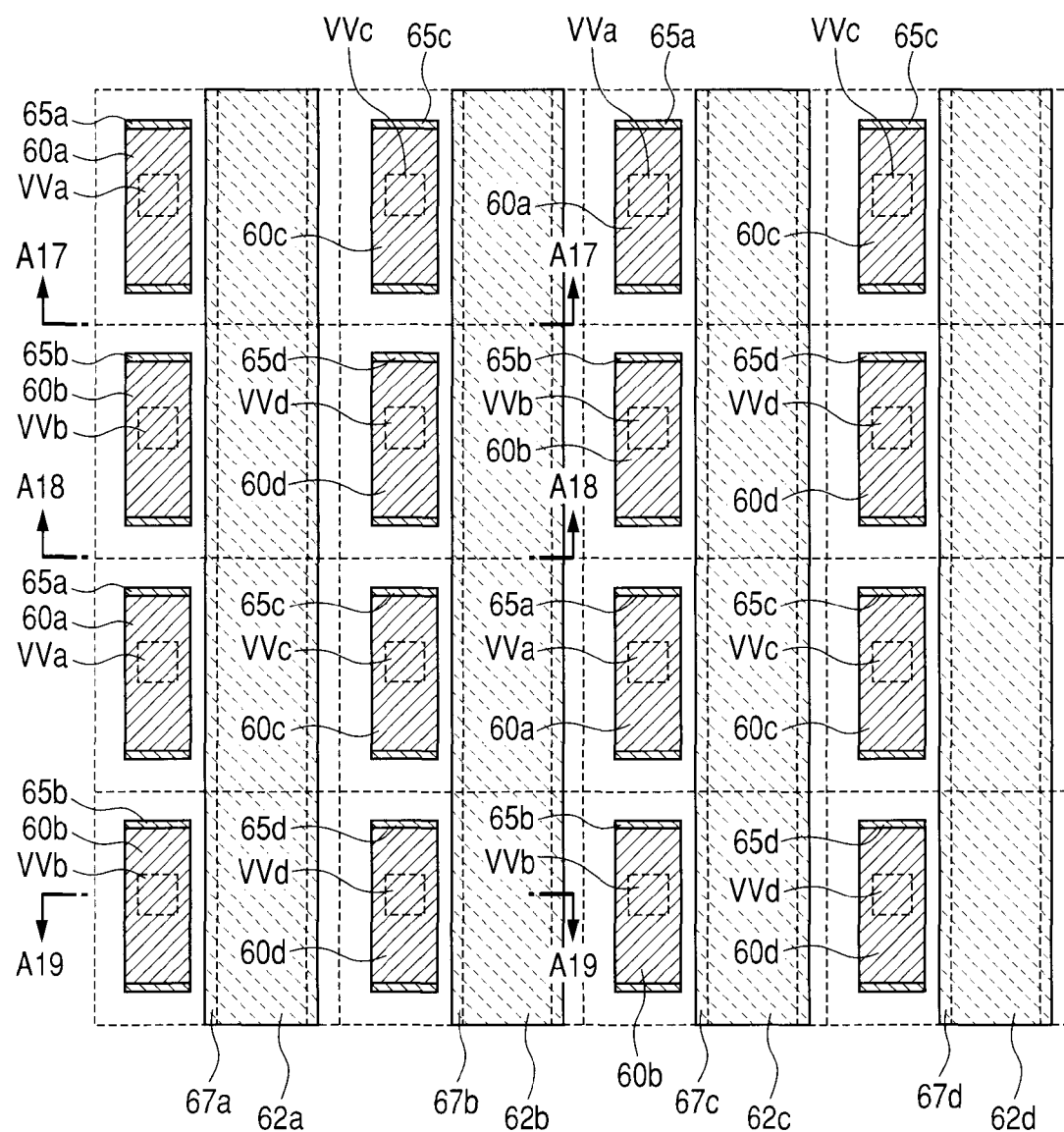
FIG. 16 is a diagram schematically illustrating a layout of more upper layer wirings in the plane layout shown in FIG. 15.

FIG. 16 is a diagram schematically illustrating a plane layout of upper fourth metal wirings in the plane layout shown in FIG. 15. The layout of the third metal wirings 60a through 60d and 62a through 62d shown in FIG. 15 is shown together in FIG. 16.

In FIG. 16, fourth intermediate wirings 65a through 65d each comprised of the fourth metal wiring are respectively disposed so as to overlap with the third intermediate wirings 60a through 60d. These fourth intermediate wirings 65a through 65d are electrically coupled to their corresponding third intermediate wirings 60a through 60d via third vias VVa through VVd.

On the other hand, fourth metal wirings 67a through 67d are respectively provided so as to overlap with the third metal wirings 62a through 62d. These fourth metal wirings 67a through 67d configure write word lines (digit lines) respectively.

Figure 17:
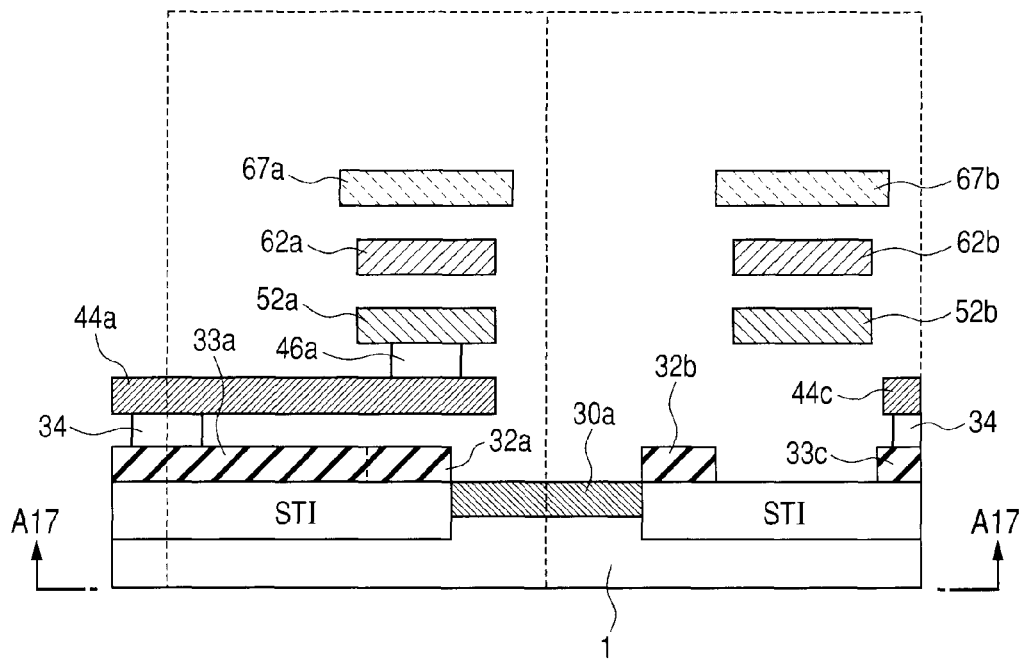
FIG. 17 is a diagram schematically showing a sectional structure taken along line A17-A17 shown in FIG. 16.

FIG. 17 is a diagram schematically showing a sectional structure of two memory cell forming regions, which is taken along line A17-A17 shown in FIG. 16. The sectional structure shown in FIG. 17 shows the layout of upper third and fourth metal wirings in the sectional structure shown in FIG. 11. The same reference numerals are attached to their corresponding parts at the components for the layers below the lower second metal wirings, and their detailed explanations will therefore be omitted.

In FIG. 17, the third metal wirings 62a and 62b are disposed over the second metal wirings 52a and 52b. The fourth meal wirings 67a and 67b are disposed in alignment with the third metal wirings 62a and 62b and thereabove.

Figure 18:
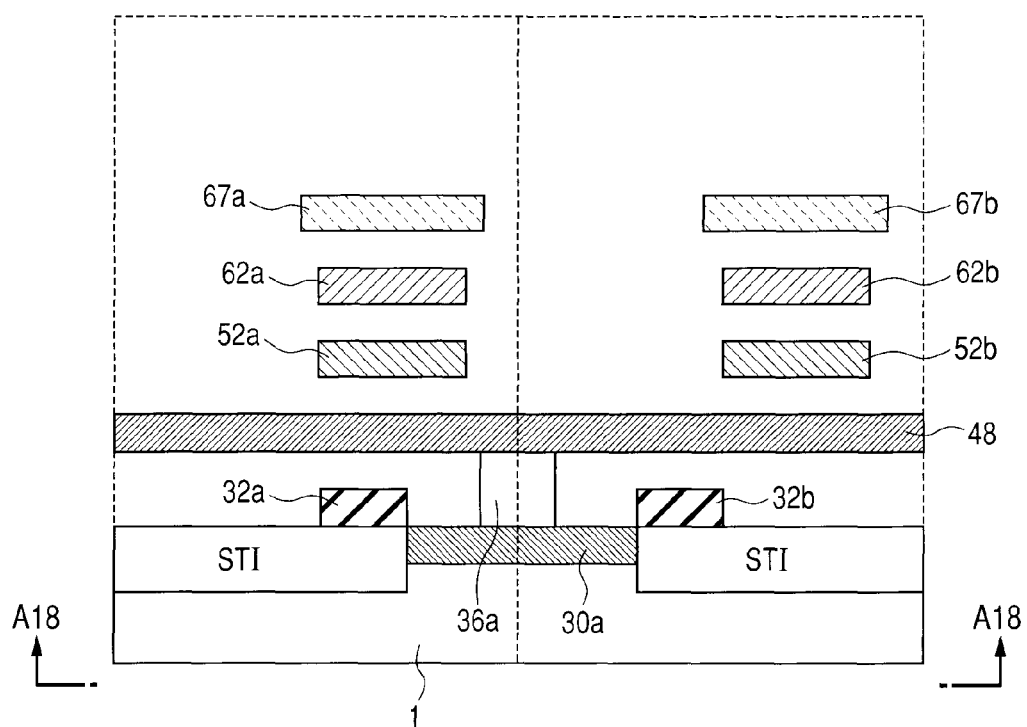
FIG. 18 is a diagram schematically showing a sectional structure taken along line A18-A18 shown in FIG. 16.

FIG. 18 is a diagram schematically showing a sectional structure of two memory cell forming regions, which is taken along line A18-A18 shown in FIG. 16. The sectional structure shown in FIG. 18 shows the layout of the upper third and fourth metal wirings with respect to the sectional structure shown in FIG. 12. Thus, also in FIG. 18, the same reference numerals are respectively attached to parts or components corresponding to the sectional structure shown in FIG. 12, and their detailed explanations will therefore be omitted.

In FIG. 18, the third metal wiring 62a and the fourth metal wiring 67a are sequentially laminated and disposed in alignment with the second metal wiring 52a. Similarly, also with respect to the second metal wiring 52b, the third metal wiring 62b and the fourth metal wiring 67b are sequentially disposed in alignment with the upper layer.

Figure 19:
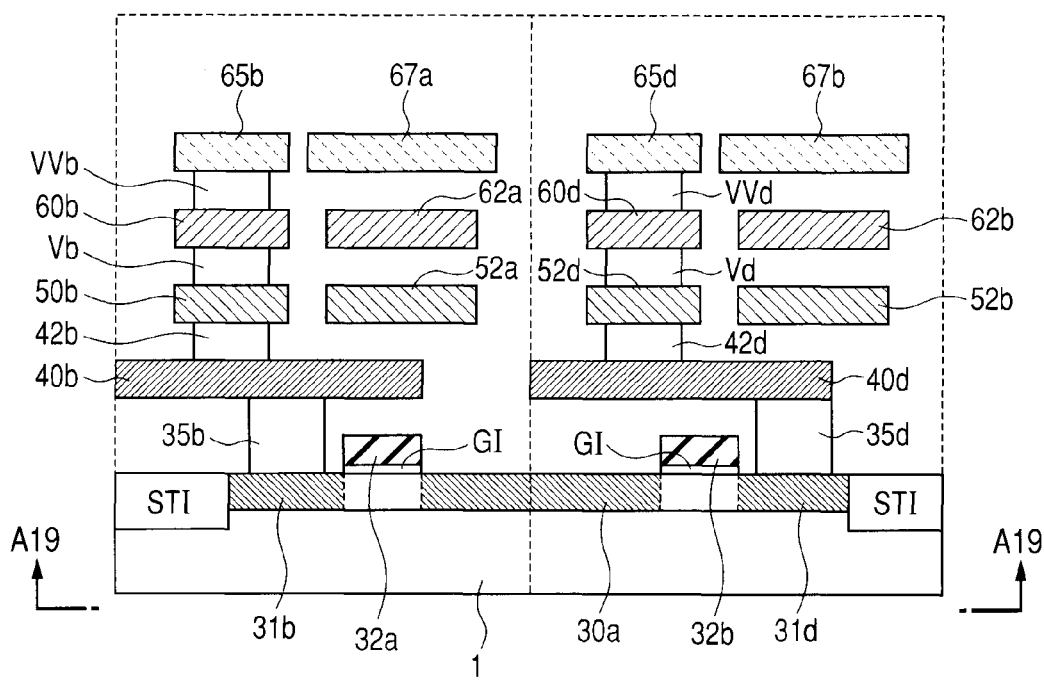
FIG. 19 is a diagram schematically showing a sectional structure taken along line A19-A19 shown in FIG. 16.

FIG. 19 is a diagram schematically showing a sectional structure of two memory cell forming regions, which is taken along line A19-A19 shown in FIG. 16. The sectional structure shown in FIG. 19 shows the layout of upper layer wirings in the sectional structure shown in FIG. 13. The same reference numerals are attached to their corresponding components located below the second metal wirings, and their detailed explanations will therefore be omitted.

The third intermediate wiring 60b is disposed in line over the second intermediate wiring 50b. The fourth intermediate wiring 65b comprised of the fourth metal wiring is disposed in line over the third intermediate wiring 60b. The third intermediate wiring 60b and the second intermediate wiring 50b are electrically coupled to each other by means of their corresponding first via Vb. The third intermediate wiring 60b and the fourth intermediate wiring 65b are electrically coupled to each other by means of their corresponding second via VVb.

The third metal wiring 62a and the fourth metal wiring 67a are disposed in line over the second metal wiring 52a. The fourth metal wiring 67a configures a digit line.

Similarly, the third intermediate wiring 60d and the fourth intermediate wiring 65d are disposed in line over the second intermediate wiring 52d. The third metal wiring 62b and the fourth metal wiring 67b are disposed in line over the second metal wiring 52b. The second intermediate wiring 52b and the third intermediate wiring 60b are electrically coupled to each other by means of their corresponding first via Vd. The third intermediate wiring 60d and the forth intermediate wiring 65b are electrically coupled to each other by means of their corresponding second via VVd.

Also where the aspect ratio of the electrical contact/plug to each variable magnetoresistive element formed in the upper layer becomes high by electrically coupling each of the first intermediate wirings each formed of the first metal wiring to each of the fourth intermediate wirings each formed of the fourth metal wiring through the via, the electrical contacts can be formed reliably.

In the configurations for providing electrical coupling to the variable magnetoresistive elements as shown in FIGS. 16 through 19, their wiring layouts have translational symmetry and the wirings can be disposed in a high density and with wiring-to-wiring pitches being kept at the minimum.

Figure 20:
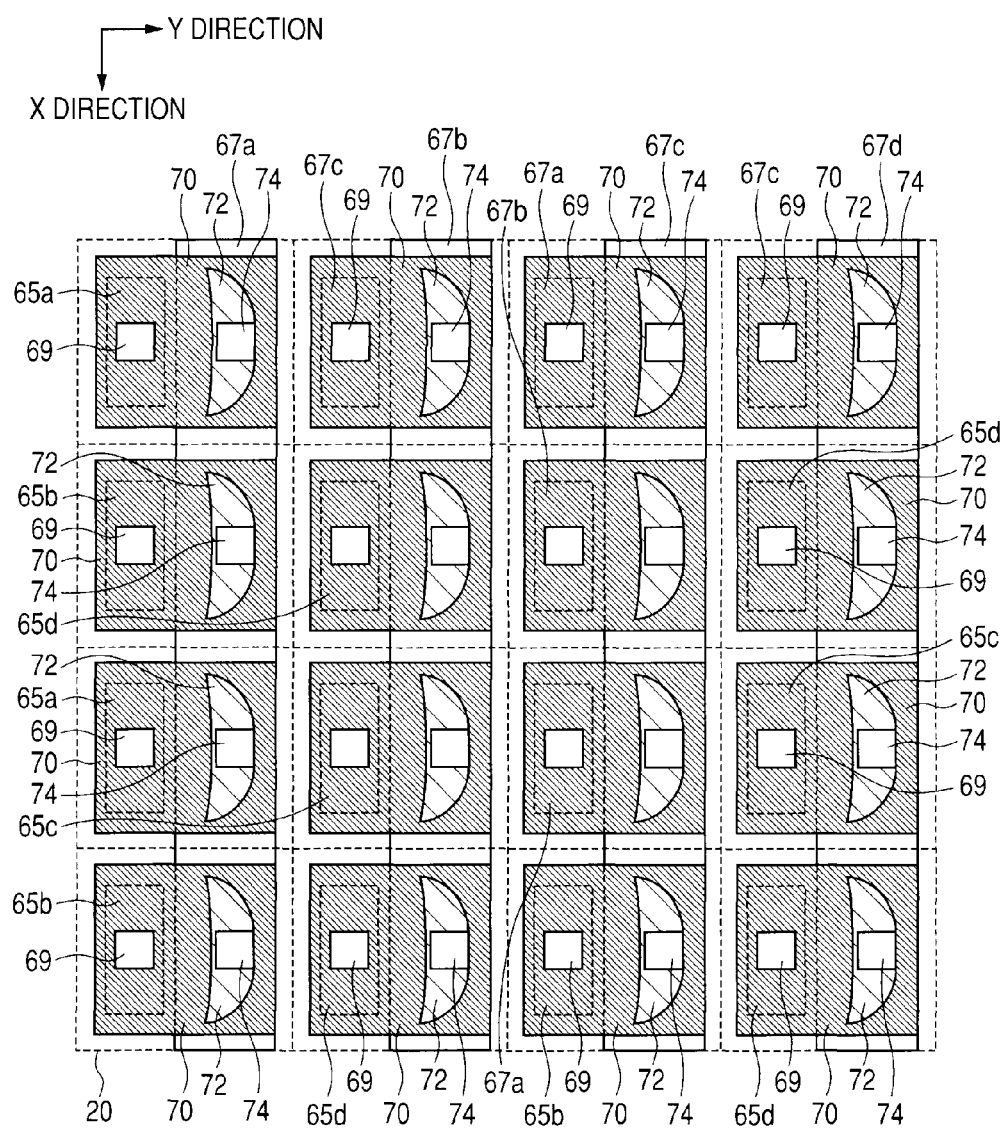
FIG. 20 is a diagram schematically illustrating a layout of upper variable magnetoresistive elements in the plane layout shown in FIG. 16.
Figure 21:
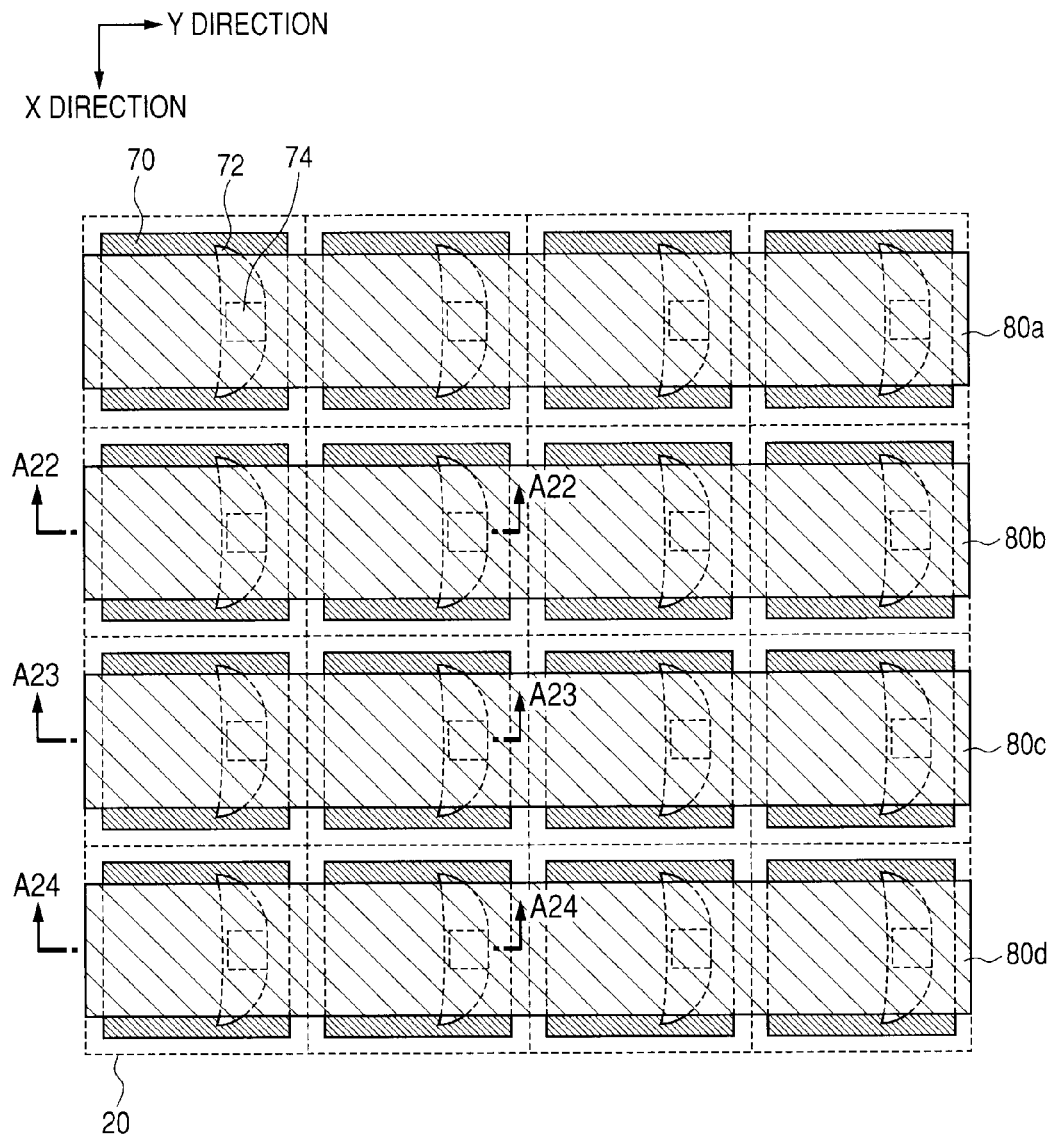
FIG. 21 is a diagram schematically showing a layout of upper fifth metal wirings in the plane layout shown in FIG. 20 together with the layout of the variable magnetoresistive elements.

FIG. 20 is a diagram schematically illustrating a plane layout of variable magnetoresistive elements disposed over the plane layout shown in FIG. 16. In FIG. 21, patterns each having the same shape are disposed in the respective memory cell forming regions 20. Namely, third vias 69 are disposed in the centers of the fourth intermediate wirings 65a through 65d. Local wirings 70 substantially square in shape are disposed over the third vias 69 respectively. The local wirings 70 are electrically coupled to their corresponding lower fourth intermediate wirings 65a through 65d through the third vias

69. Since the local wirings 70 and the third vias 69 are identical in layout in the memory cell forming regions arranged in 4 rows and 4 columns shown in FIG. 20, reference numerals for these components are attached only to the memory cell forming regions disposed at the outer periphery of the 4 rows and 4 columns.

Variable magnetoresistive elements 72 are respectively disposed at positions on the local wirings 70, corresponding to the fourth metal wirings 67a through 67d. Each of the variable magnetoresistive elements 72 has a shape surrounded by two arcs different in curvature from each other. Forming each variable magnetoresistive element in a semicircular or crescent-shaped manner suppresses magnetization inversion at its peripheral region and suppresses the occurrence of miswriting.

Upper electrodes 74 are disposed in the centers of the variable magnetoresistive elements 72. Each of the upper electrodes 74 has the function of forming the electrical contact to each bit line disposed at its upper layer together.

As shown in FIG. 20, the layouts of parts related to the variable magnetoresistive elements are all repeatedly arranged in the same patterns in the X and Y directions. This simplifies the layout of the patterns for the variable magnetoresistive elements, realizes accurate patterning and suppresses variations in the resistance values of the variable magnetoresistive elements.

FIG. 21 is a diagram schematically showing a layout of upper fifth metal wirings in the plane layout shown in FIG. 20. In FIG. 21, reference numerals are attached to a plane layout for one MRAM cell with respect to a MRAM cell configuration. The layout of the local wiring 70, variable magnetoresistive element 72 and upper electrode 74 is identical in the respective memory cell forming regions 20. The same pattern is repeatedly disposed in the X and Y directions with respect to the respective memory cell forming regions.

Fifth metal wirings 80a through 80d respectively extend continuously in the Y direction and are respectively disposed corresponding to the respective memory cell columns with being spaced from one another. The fifth metal wirings 80a through 80d respectively configure bit lines and are electrically coupled to the upper electrodes 74 of the corresponding memory cells (variable magnetoresistive elements). Thus, the variable magnetoresistive elements 72 are electrically coupled to their corresponding bit lines (80a through 80d).

Figure 22:
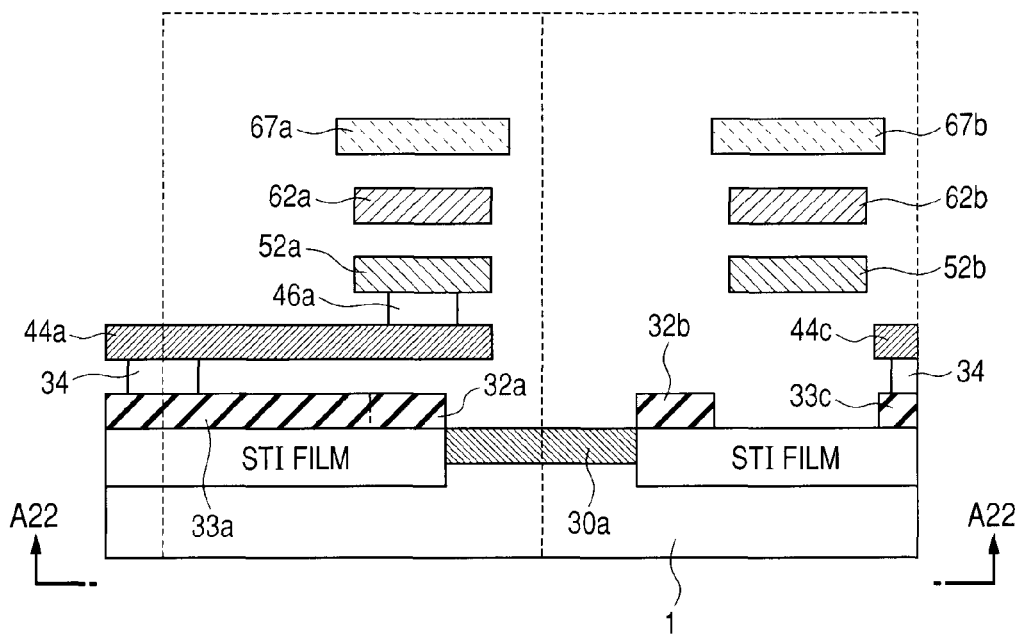
FIG. 22 is a diagram schematically illustrating a sectional structure taken along line A22-A22 shown in FIG. 21.

FIG. 22 is a diagram schematically illustrating a sectional structure of two memory cell forming regions, which is taken along line A22-A22 shown in FIG. 21. The sectional structure shown in FIG. 22 corresponds to the sectional structure shown in FIG. 17. The local wirings 70 are not provided at the boundary regions of the memory cell forming regions along the X direction. The sectional structure shown in FIG. 22 becomes the same structure as the sectional structure shown in FIG. 17. Their corresponding parts are given the same reference numerals respectively and their detailed explanations will therefore be omitted.

Figure 23:
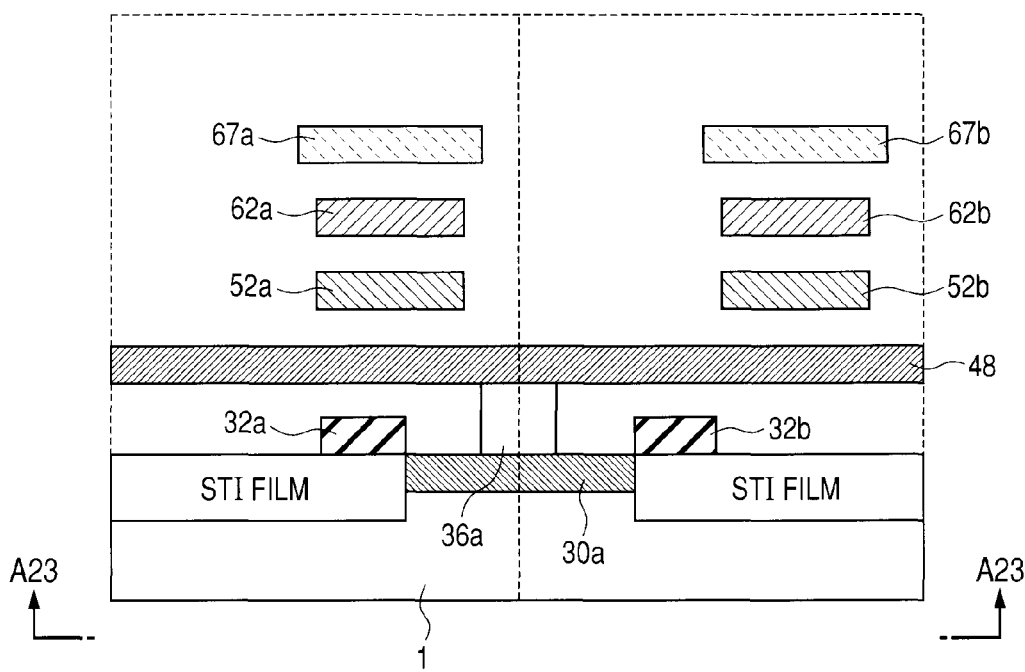
FIG. 23 is a diagram schematically showing a sectional structure taken along line A23-A23 shown in FIG. 21.

FIG. 23 is a diagram schematically showing a sectional structure of two memory cell forming regions, which is taken along line A23-A23 shown in FIG. 21. The sectional structure shown in FIG. 23 corresponds to a sectional structure of a region in which a metal source line 48 is disposed. Since no memory cells are formed in the region, the variable magnetoresistive elements 72 are not disposed and the local wirings 70 are not disposed either. Accordingly, the sectional structure shown in FIG. 23 becomes the same structure as the sectional structure shown in FIG. 18. The same reference numerals are attached to their corresponding parts, and their detailed explanations will therefore be omitted.

Figure 24:
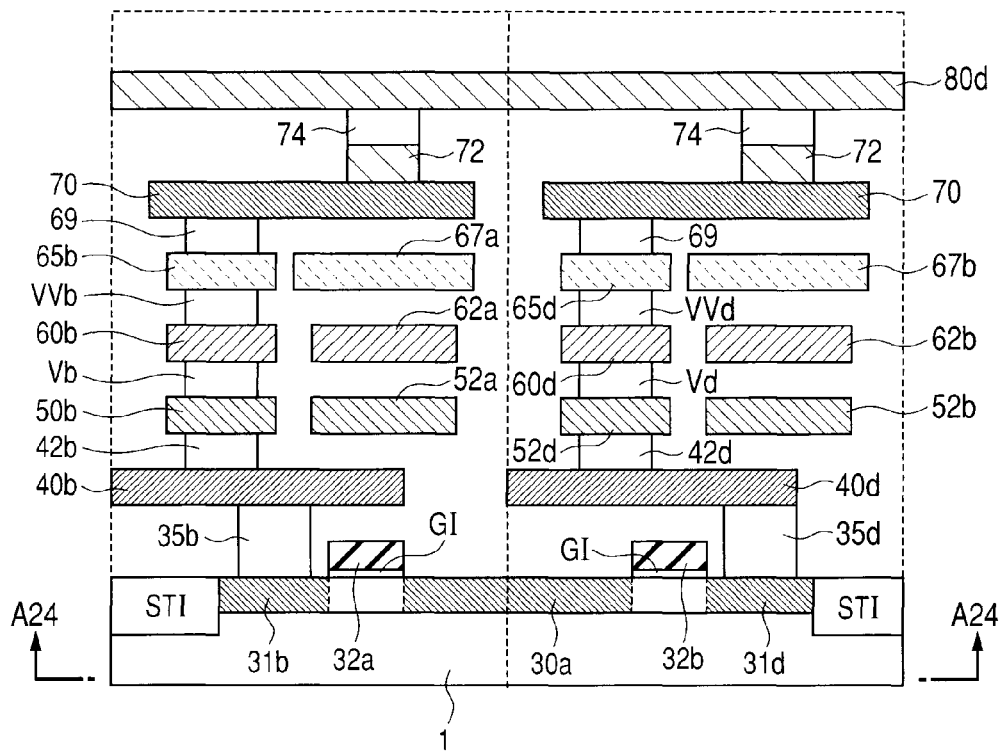
FIG. 24 is a diagram schematically depicting a sectional structure taken along line A24-A24 shown in FIG. 21.

FIG. 24 is a diagram schematically showing a sectional structure of two memory cell forming regions, which is taken along line A24-A24 shown in FIG. 21. In the sectional structure shown in FIG. 24, variable magnetoresistive elements are further disposed in the upper layer of the sectional structure shown in FIG. 19. In FIG. 24, parts corresponding to those of the configuration shown in FIG. 19 are respectively given the same reference numerals, and their detailed explanations will therefore be omitted.

In the memory cell forming regions, the third vias 69 are disposed over their corresponding fourth intermediate wirings 65b and 65d. These third vias 69 are respectively electrically coupled to the local wirings 70. The variable magnetoresistive elements 72 are disposed over the local wirings 70 so as to align with the fourth metal wirings 67a and 67b. The variable magnetoresistive elements 72 are electrically coupled to the upper fifth metal wiring 80d via the upper electrodes 74. The fifth metal wiring 80d configures a bit line.

As shown in these FIGS. 24 and 21, the wirings disposed in the layers above the access transistors are repeatedly disposed in the same pattern along the X and Y directions. The wirings respectively have translational symmetry and can be disposed in a high density.

Incidentally, although described in detail later, the first intermediate wirings 40b and 40d for coupling the variable magnetoresistive elements and the drain regions of the access transistors are all made equal in length with respect to the memory cells of each adjacent column. Thus, the electric resistances and parasitic capacitances from the bit lines to the source lines (fifth metal wirings 80 (80a through 80d) to the source impurity regions 30 (30a and 30b)) are made equal respectively, and RC delays of paths through which write and read currents flow, are made equal to each other, thereby uniformizing write/read characteristics at the respective memory cells.

According to the first embodiment of the present invention as described above, the word line shunt forming regions are disposed in the boundary regions of the memory cell forming regions, extending along the X direction. Further, the word line shunt contacts are disposed in the boundary regions extending in the Y direction, of the memory cell forming regions. It is thus possible to sufficiently enlarge the distance between each of the word line shunt contacts and each of the drain contacts for coupling the access transistors to the variable magnetoresistive elements. Accordingly, even if pattern shifts occur at the word line shunt protrusions, it is possible to suppress the occurrence of contact with the drain contacts or the drain impurity regions or the overlaying of the drain impurity regions and the protrusions and prevent transistor characteristics from being deteriorated.

The word line shunt protrusions are disposed in the boundary regions extending along the X direction, of the memory cell forming regions. The protrusions can therefore be disposed with sufficient margins without increasing the layout areas of the memory cell forming regions (this is because the drain impurity regions are different in spacing along the X direction every two memory cells). The distances between the drain contacts are made different every memory cell in like manner. Consequently, each metal source line can be disposed in the region in which the distance between the drain contacts is large, and the metal source line broad in width can be disposed with a margin. Correspondingly, the source line resistance of the mesh-like source line structure can be further reduced.

Since the word line shunt regions are respectively placed in the positions different at the adjacent rows and the source contacts are disposed between the adjacent rows, one word line shunt region can be disposed every four rows at the individual memory cell columns. Further, the source line shunt contacts can be disposed one every two rows or columns at the respective metal source lines. Thus, the metal source lines can be disposed every two memory cells in the X direction (this is because, since each metal source line is disposed in the region in which the distance between the drain contacts is long, the region in which the distance between the drain contacts is large is provided one every two memory cells along the X direction).

Second Embodiment

Figure 25:
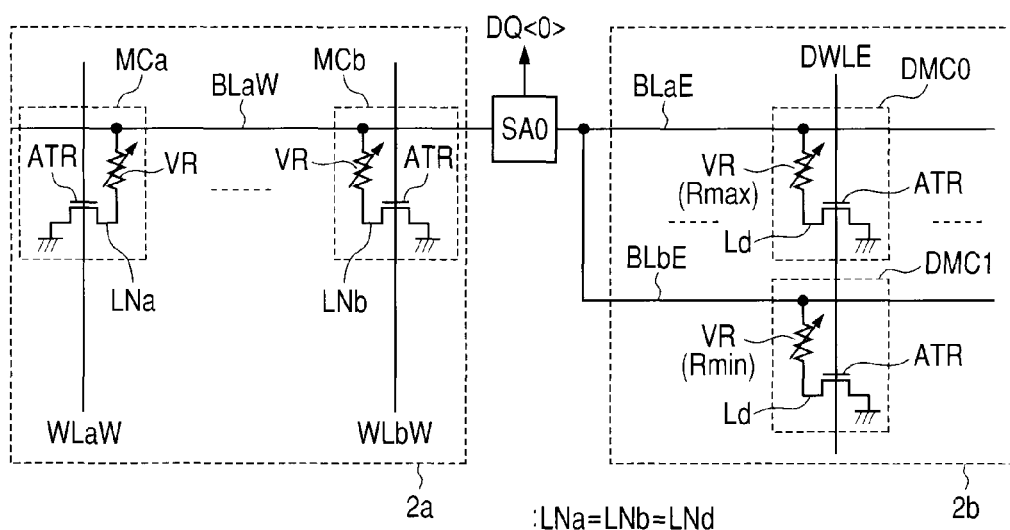
FIG. 25 is a diagram schematically showing a fragmentary configuration of a modification of a second embodiment of the present invention.

FIG. 25 is a diagram schematically showing a fragmentary configuration of an MRAM according to a second embodiment of the present invention. A mode of coupling of MRAM cells to a sense amplifier where at memory subarrays 2a and 2b, memory cells of the memory subarray 2a are selected is schematically shown in FIG. 25. At the memory subarray 2a, memory cells MCa and MCb are coupled to a bit line BLaW. These memory cells MCa and MCb are different in position within the memory subarray 2a. Gates of corresponding access transistors ATR are coupled to their corresponding word lines WLaW and WLbW.

The bit line BLaW is coupled to its corresponding sense amplifier SA0 upon data reading. At the memory cell MCa, a variable magnetoresistive element VR and an access transistor ATR are interconnected with each other by means of an internal wiring LNa (intermediate wiring 40: any of 40a through 40d). At the memory cell MCb, a variable magnetoresistive element VR and an access transistor ATR are interconnected with each other by means of an internal wiring LNb (40).

On the other hand, at the memory subarray 2b, reference cells DMC0 and DMC1 are disposed in the center thereof as viewed in its column direction (bit line extending direction). These reference cells DMC0 and DMC1 respectively have the same structure as the memory cells MCa and MCb. Gates of access transistors ATR of the reference cells are coupled in common to a dummy word line DWLE. A variable magnetoresistive element VR and an access transistor ATR of each reference cell are coupled to each other by means of an internal wiring Ld.

The variable magnetoresistive element VR of the reference cell DMC0 is set to a high resistance state and has a resistance value Rmax. The variable magnetoresistive element VR of the reference cell DMC1 is set to a low resistance value and has a resistance value Rmin.

Upon the data reading, the sense amplifier SA0 detects the level of current flowing through the bit line BLaW with the average value of reference currents flowing through the bit lines BLaE and BLbE as a reference current and thereby generates internal read data DQ<0>.

At these reference cells DMC0 and DMC1, their positions are fixedly defined within the memory subarray 2d. Accordingly, the reference current for the sense amplifier SA0 can be set nearly constant.

On the other hand, at the memory subarray 2a, the memory cells MCa and MCb are different in position therewithin. The distance between the bit line BLaW and the sense amplifier SA0 varies. When the resistance values of the MRAM cells (variable magnetoresistive elements VR) coupled to the bit line BLaW differ from each other, the influence of resistance values and parasitic capacitances contained in the internal wirings LNa and LNb on the bit line BLaW varies. Particularly when the parasitic capacitances and wiring capacitances of the internal wirings LNa and LNb differ upon data reading, there occurs a case where the differences between the memory cell current and the reference currents flowing through the bit lines BLaE and BLbE differ, thereby causing a possibility that it will not be possible to perform accurate reading.

Particularly when the number of memory cells in the memory subarray 2a increases, the wiring capacitance of each bit line BLaW increases. Therefore, the influence of variations in the capacitance of each bit line becomes large. Thus, even when the access transistors are disposed mirror-symmetrically at the MRAM cells, the upper internal wirings LNa and LNb are shaped in the same form of translational symmetry, their lengths are made equal to each other and the parasitic capacitances and resistances thereof are set equal to each other.

Thus, even when the positions in the memory subarrays 2b of the reference cells DMC0 and DMC1 are different, i.e., where MRAM cells lying in even-numbered rows are used as reference cells at the memory subarray 2b and MRAM cells lying in odd-numbered rows are used as reference cells, the capacitances/wiring resistances of internal wirings Ld of the reference cells can always be set equal to each selected memory cell. Consequently, the trouble of, for example, providing the reference cells in two rows according to the position of each selected memory cell at the memory subarray 2a and selecting the reference cells of the same shape (internal wirings for drain contacts are of the same shape) according to the position of each selected memory cell at the memory subarray 2a becomes unnecessary and control becomes easy. Further, the reference currents can be generated accurately by means of the reference cells corresponding to one row, and the area of a layout region of each reference cell can be reduced.

Figure 26:
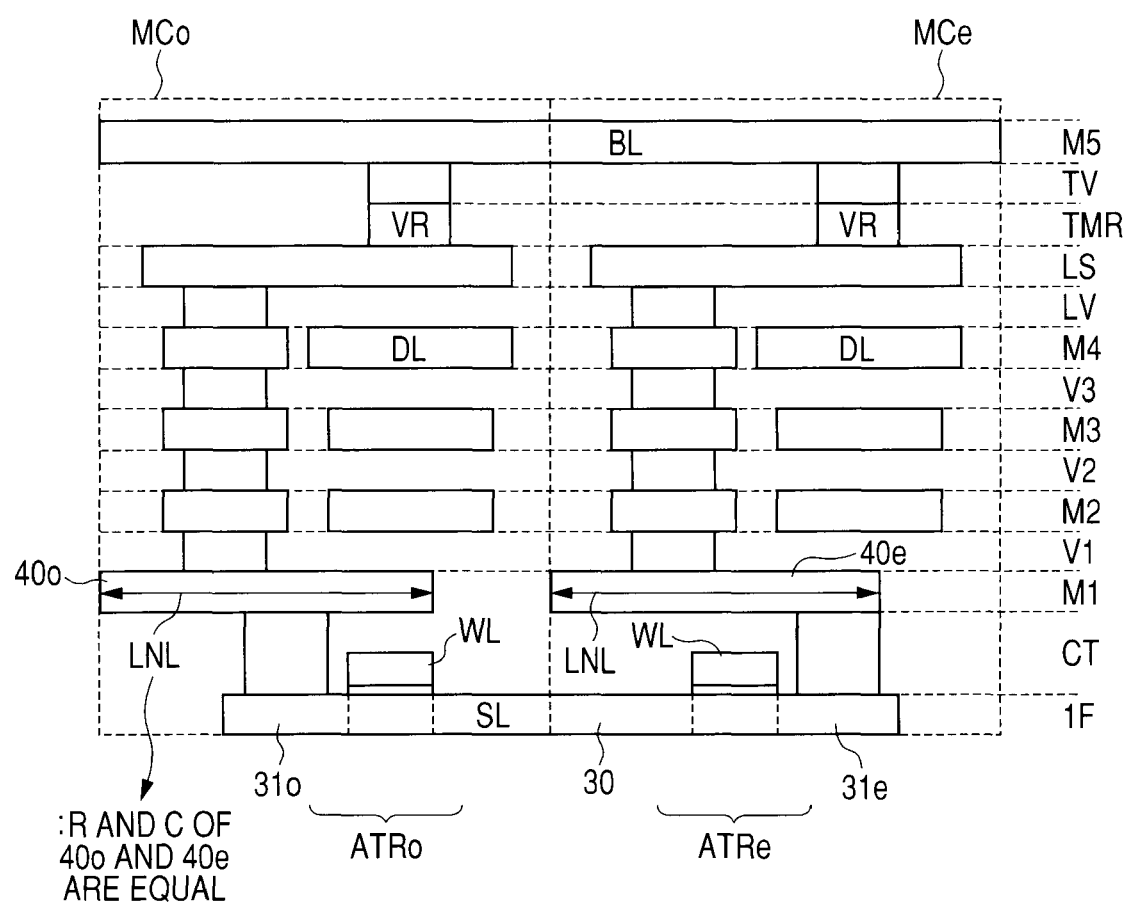
FIG. 26 is a diagram schematically illustrating a sectional structure of an MRAM according to the second embodiment of the present invention.

FIG. 26 is a diagram schematically illustrating a sectional structure of memory cells MCo and MCe according to the second embodiment of the present invention. These memory cells MCo and MCe share a source line SL (source impurity region 30). At these memory cells MCo and MCe, the lengths of first metal wirings (first intermediate wirings) 40o and 40e formed in a first metal wiring layer (M1) are both set to LNL. It is thus possible to equalize wiring resistances and capacitances for drain impurity regions 31o and 31e of an active region 1F as viewed from a leading or drawing electrode layer LS of each variable magnetoresistive element VR.

Access transistors ATRo and ATRe are disposed symmetrically with respect to the boundary region between the memory cells MCo and MCe, and channel resistances are set equal to each other. Accordingly, the lengths each extending from a bit line BL formed in a fifth metal wiring layer M5 to the source line SL formed by the source impurity region 30 can be made equal, and the wiring resistance and capacitance can be equalized.

Since the lengths of respective wirings/vias/contacts at an upper electrode layer TV, a variable magnetoresistive element layer TMR, the leading electrode layer LS, leading electrode vias LV, a fourth metal wiring layer M4, a third metal wiring layer M3, a third via layer V3, a second via layer V2, the first metal wiring layer M1 and a contact layer CT are set equal to one another in FIG. 26, the distances each extending between the bit line BL and the active region 1F can all be set equal. Further, all of the upper layer wirings of the access transistors ATRo and ATRe have translational symmetry and their shapes are set equal. Thus, the resistance and capacitance (except for the resistance value of each variable magnetoresistive element VR) of each path extending from the bit line to the source line can be set equal at each memory cell.

Modification

Figure 27:
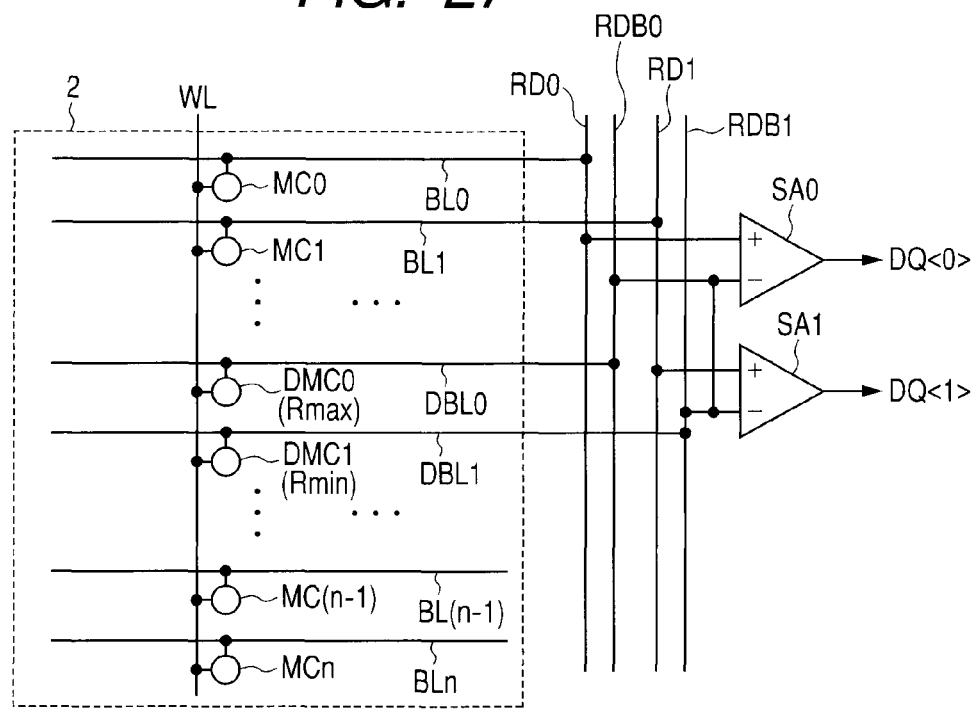
FIG. 27 is a diagram schematically depicting a configuration of a modification of the second embodiment of the present invention.

FIG. 27 is a diagram schematically depicting a fragmentary configuration of an MRAM of a modification of the second embodiment of the present invention. In FIG. 27, memory cells MC0 through MCn are disposed in line in a row direction at a memory subarray 2. In the memory cell row, reference cells DMC0 and DMC1 identical in structure to the memory cells MC0 through MCn are disposed in line in the center of the memory subarray. The reference cell DMC0 is placed in a high resistance state and has a resistance value Rmax. The reference cell DMC1 is placed in a low resistance state and has a resistance value Rmin. Bit lines BL0 through BLn are disposed corresponding to the memory cells MC0 through MCn respectively. Reference bit lines DBL0 and DBL1 are disposed corresponding to the reference cells DMC0 and DMC1 respectively.

At the layout of the memory subarray shown in FIG. 27, the memory cells and the reference cells are disposed together in line in the row direction at one memory subarray 2. The reference cells are respectively disposed corresponding to dummy cell columns.

Internal read data lines RD0, RDB0, RD1 and RDB1 are disposed inside the memory subarray 2 for the purpose of data reading. The internal read data lines RD0 and RDB1 are respectively coupled to positive and negative inputs of a sense amplifier SA0. The internal read data lines RD1 and RDB1 are respectively coupled to positive and negative inputs of a sense amplifier SA1.

The negative inputs of the sense amplifiers SA0 and SA1 are interconnected with each other. Upon the data reading, for example, the bit lines BL0 and BL1 are selected and coupled to the internal read data lines RD0 and RD1 respectively. Here, a column selection circuit for selecting a read column is not shown in FIG. 27 for simplification of the drawing.

At this time, the reference bit lines DBL0 and DBL1 are respectively coupled to the internal read data lines RDB0 and RDB1. The sense amplifiers SA0 and SA1 are activated to execute sense operations. At this time, the negative inputs of the sense amplifiers SA0 and SA1 are interconnected with each other and hence the average value of a reference current I (Rmax) flowing through the reference cell DMC0 placed in the high resistance state and a current I (Rmin) flowing through the reference cell DMC1 placed in the low resistance state flows into the negative inputs of the sense amplifiers SA0 and SA1 as a reference current. With the average current of the negative inputs as the reference current, currents that flow through the bit lines BL0 and BL1 via the internal read data lines RD0 and RD1 are detected to generate internal read data DQ<0> and DQ<1>.

In the configuration shown in FIG. 27, the positions in the column direction, of the reference cells differ according to the positions in the column direction (bit line extending direction) of the selected memory cells. Thus, the lengths of internal coupling nodes LN of each memory cell MC and each reference cell DMC are set equal to each other. Consequently, the capacitances of the bit line and dummy bit line can be set constant regardless of the position of each selected word line. The timing provided to generate a necessary difference between the reference current and the cell current can be kept nearly constant. Further, a sense margin can be made large and sense timing can be fastened.

According to the second embodiment of the present invention as described above, the lengths (with respect to the bit line extending direction) of the coupling wirings (intermediate wirings) relative to the drain impurity regions between the access transistors and the variable magnetoresistive elements are set equal at the memory cells that share the source line. Regardless of the positions of the memory cells, the parasitic resistances and capacitances incidental on the drain impurity regions can be equalized. Correspondingly, variations in RC delay of each bit line can be suppressed. It is thus possible to suppress variations in the cell current and the reference current at the data reading and perform accurate data reading with quick timing.

Third Embodiment

Figure 28:
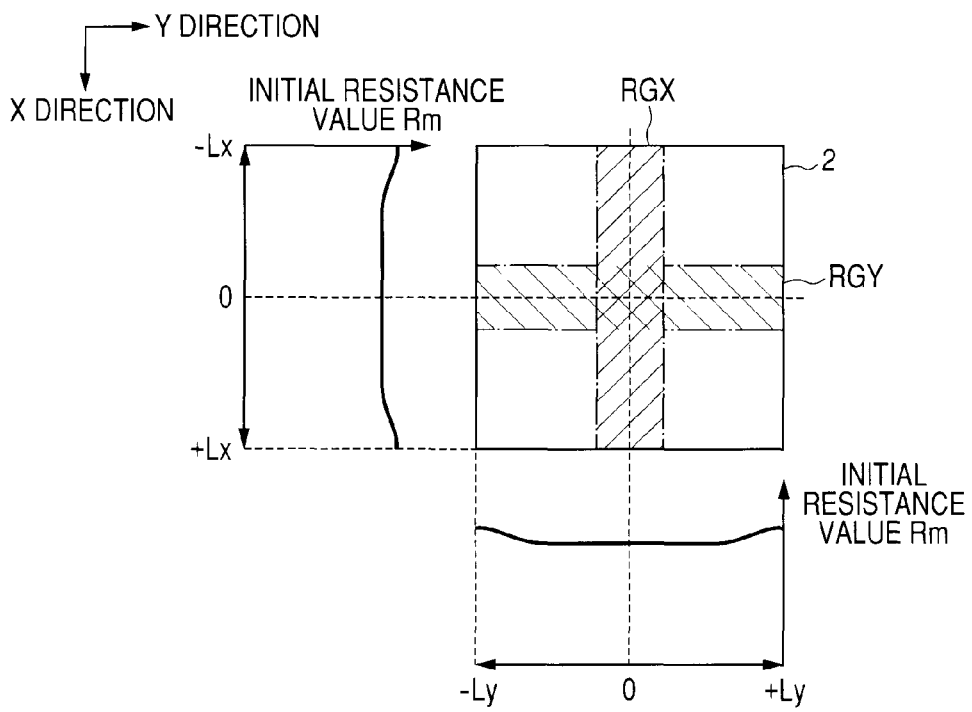
FIG. 28 is a diagram schematically showing a memory cell area of an MRAM according to a third embodiment of the present invention.

FIG. 28 is a diagram schematically showing a distribution of an initial resistance value of each variable magnetoresistive element at one memory subarray 2. In FIG. 28, the initial resistance value Rm of the variable magnetoresistive element easily increases from the center 0 of the memory subarray 2 to its ends (Lx and −Lx) in the X direction and becomes the highest at its peripheral portion. Similarly, as the distance from the center increases from the center (0) of the memory subarray 2 to its ends +Ly and −Ly in the Y direction, the initial resistance value Rm increases.

At each MRAM cell, a variable magnetoresistive element is formed by a ferromagnetic body and a barrier layer lying therebetween. The resistance value of the variable magnetoresistive element exponentially increases in accordance with the film thickness of the barrier layer. It is thus necessary to couple the barrier layer as thinly as possible. There is a need to accurately determine the composition and shape of the ferromagnetic body. Since the variable magnetoresistive element is formed between upper layer metal wirings like the fourth and fifth metal wiring layers in particular, it is susceptible to the shape/height of a base or bed. Therefore, planarization is difficult and the film thickness or the like of the variable magnetoresistive element is liable to change at a CMP (chemical mechanical polishing) process at the planarization. The degree of this influence has a tendency to increase at the end of a memory subarray at the end of each repetitive pattern.

Normally, in order to accurately patternize such repetitive patterns that the same pattern is repeatedly disposed as in the memory cell array or the like, dummy patterns each having the same pattern are disposed outside the region in which the repetitive patterns are disposed. They are generally called "shape dummy cells" at each memory. By disposing the same patterns to the outside continuously, the implementation of accurate patterning is achieved while suppressing variations in the mask and condition at exposure in a manufacturing process at a memory array end. At the periphery of the memory subarray 2, however, the same patterns are not repeatedly disposed over a sufficient distance as compared with each memory cell located at its central part, and variations in the flatness at the CMP process occur due to an influence such as a step due to pattern variations. Hence the resistance value of the variable magnetoresistive element of each memory cell at the peripheral portion tends to increase.

In general, each memory cell for storing data therein is disposed using a region or area lying within a range in which variations in the initial resistance value Rm are allowed at the memory subarray 2. The area, in which the variations in the resistance value are large, is used as a so-call shape dummy cell area and simply utilized only to maintain the regularity of patterning.

Normally, when the memory cell current and the reference current are utilized upon the data reading, the reference current is generated using the corresponding reference cell having the same structure as each MRAM cell. Thus, the influence of variations in the manufacture of each MRAM cell can be cancelled out by the MRAM cell and the reference cell within one memory subarray. In this case, there is, however, a possibility that when each reference cell is disposed at the end of the memory subarray, its initial resistance value varies with respect to a predetermined value and the accurate reference current (intermediate current) cannot be generated.

There are therefore provided regions or areas in which variations in the initial resistance values of the variable magnetoresistive elements are small, i.e., reference areas (dummy cell areas 15W and 15E shown in FIG. 2) in which reference cells are disposed in the central region of the memory subarray 2. Namely, the reference cells are disposed in either of reference cell (dummy cell) regions or areas RGX and RGY. The reference cell area RGX is configured by the reference cells arranged in the row direction. The corresponding reference cell is selected by a dummy word line to allow a reference cell current to flow through its corresponding bit line (configuration shown in FIG. 27). The reference cell area RGY is configured by the reference cells arranged in the column direction (configuration shown in FIG. 29). Each reference cell is coupled to its corresponding reference bit line and selected by the same word line as each selected MRAM cell.

Figure 29:
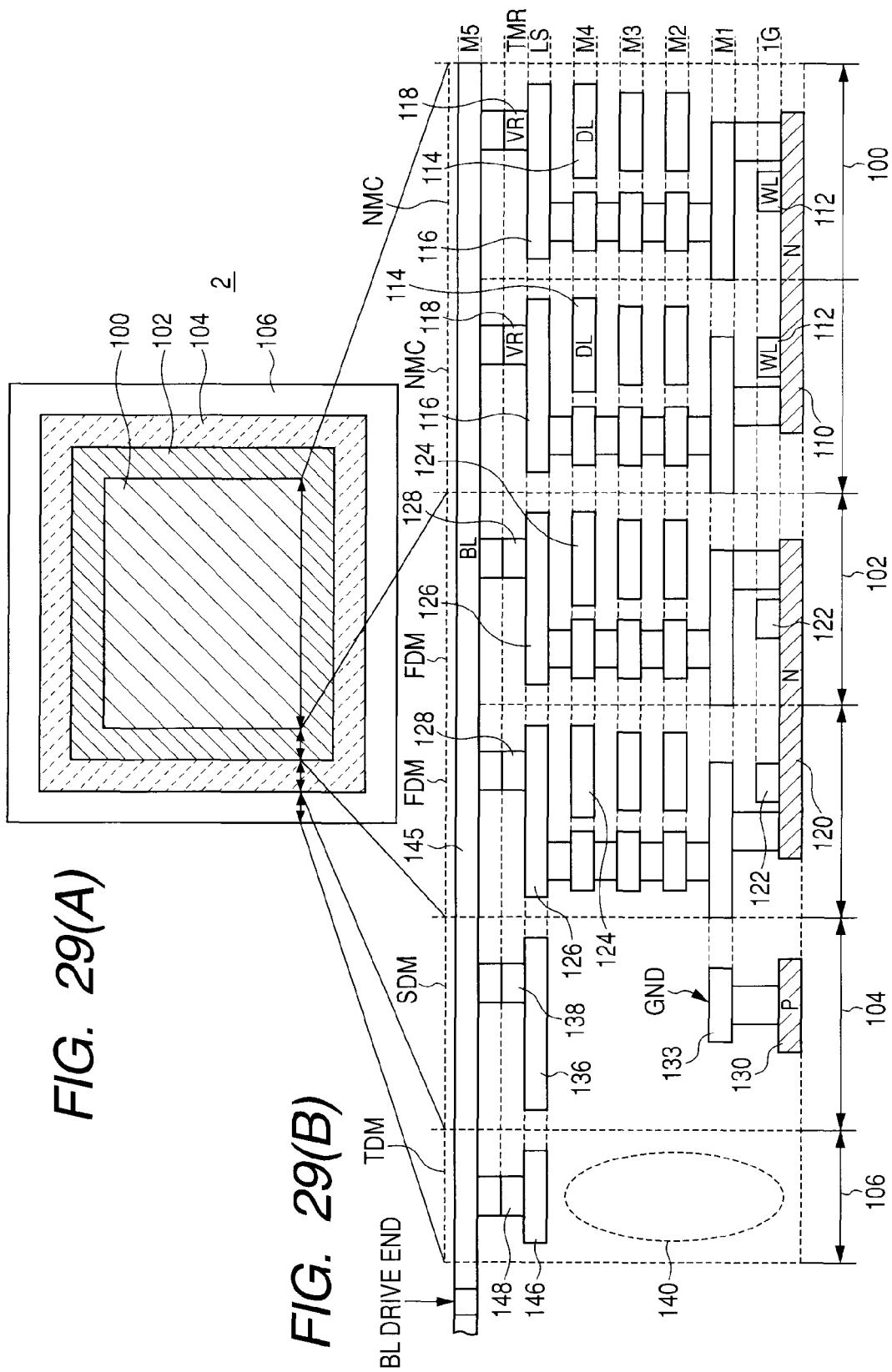
FIG. 29 is a diagram schematically illustrating a layout of a memory subarray of an MRAM according to a fourth embodiment of the present invention.

At the memory subarray 2, there may be used, as a data read system, either of such configurations that in an open bit line system, reference cells are disposed at two memory subarrays (2a and 2b) and that memory cells and reference cells are selected in parallel at one memory subarray as shown in FIG. 29.

According to the third embodiment of the present invention as described above, the reference cells are disposed in the central region lying within the memory subarray. The variations in the resistance value of each reference cell from the desired value can be reduced and the accurate reference current can be generated. Correspondingly, the accurate reading of data can be carried out (read margin can be enlarged) and high-speed reading can be implemented.

Fourth Embodiment

FIGS. 29(A) and 29(B) are diagrams schematically illustrating a configuration of a memory subarray of an MRAM according to a fourth embodiment of the present invention. In FIG. 29(A), the memory subarray 2 includes a normal cell area 100 in which normal MRAM cells that store data therein are disposed, and shape dummy areas 102, 104 and 106 disposed at the outer periphery of the normal cell area 100. Shape dummy cells provided to maintain the regularity of patterns for the normal MRAM cells and implement accurate patterning and unused for data storage are disposed in the shape dummy areas 102, 104 and 106. Shape dummy cells different in structure are respectively disposed in the shape dummy areas 102, 104 and 106. These shape dummy cells are disposed to maintain the regularity of the patterns for the normal MRAM cells. The normal MRAM cells and the shape dummy cells are disposed in line in the row and column directions.

FIG. 29(B) is a diagram schematically showing a sectional structure taken along a bit line extending direction (column direction: Y direction), of the memory subarray 2 shown in FIG. 29(A).

In FIG. 29(B), normal MRAM cells MMC that store data therein are disposed in the normal cell area 100. Each of the normal MRAM cells NMC includes an active region 110 in which an access transistor is formed, a gate word line 112 that configures a word line WL, a fourth metal wiring 114 that configures a digit line DL, a local wiring 116 that places a variable magnetoresistive element thereon, and the variable magnetoresistive element 118 as described in the embodiments mentioned up to now. Data is stored by the direction of magnetization of a free layer of the variable magnetoresistive element (VR) 118.

A first shape dummy area 102 is disposed along the outer periphery of the normal cell area 100. First shape dummy cells FDM identical in structure to the normal MRAM cell NMC are disposed. Namely, the first shape dummy cell FDM includes an active region 120, a gate wiring 122 lying in the same layer as the word line WL, a fourth metal wiring 124 of the same wiring layer as the digit line DL, a local wiring 126 of the same wiring layer as the local wiring 116, and a variable magnetoresistive element 128 having the same structure as the variable magnetoresistive element 118.

A second shape dummy area 104 is disposed along the outer periphery of the first shape dummy area 102, and a second shape dummy cell SDM is formed therein. The second shape dummy cell SDM includes a local wiring 136 included in a local wiring layer LS, and a variable magnetoresistive element 138 included in a variable magnetoresistive element layer TMR. The local wiring 136 and the variable magnetoresistive element layer 138 have the same structure (pattern) as the local wiring 116 and the variable magnetoresistive element 118 of the normal MRAM cell NMC. Transistors corresponding to the access transistors are not formed below the local wiring 136. A P-type active region 130 and an electrode wiring 133 of a first metal wiring layer M1 are provided below the local wiring 136. The first metal electrode wiring 133 is coupled to a ground node GND and supplies a substrate bias voltage to a P-type well (semiconductor substrate region) of the memory subarray 2 via P-type active region 130.

A third shape dummy area 106 is disposed along the outer periphery of the second shape dummy area 104, and a third shape dummy cell TDM is formed therein. The third shape dummy cell TDM has a local wiring 146 included in the local wiring layer LS, and a variable magnetoresistive element 148 included in the variable magnetoresistive element layer TMR. The local wiring 146 and the variable magnetoresistive element 148 have the same structure/pattern as the local wiring 116 and the variable magnetoresistive element 118 of the normal MRAM cell NMC.

In the third shape dummy area 106, transistors or wirings of a subarray peripheral circuit are disposed below the local wiring 146.

The variable magnetoresistive element 118 of the normal MRAM cell NMC and the variable magnetoresistive elements 128, 138 and 148 of the shape dummy cells FDM, SDM and TDM are coupled to their corresponding bit lines BL via upper electrodes.

As shown in FIGS. 29(A) and 29(B), the first shape dummy cells FDM each having the same pattern as the normal MRAM cell are disposed at the outer periphery. Thus, the repetition of patterns in the normal cell area 100, of the variable magnetoresistive elements VR (118) and the access transistors is maintained. The access transistors and variable magnetoresistive elements of the normal MRAM cells NMC in the normal cell area 100 are patterned accurately.

The second shape dummy cell SDM and the third shape dummy cell TDM are respectively disposed in the second shape dummy area 104 and the third shape dummy area 106. Dummy magnetoresistive elements of the same structure/pattern as the variable magnetoresistive elements VR of the normal MRAM cells NMC are disposed in these dummy areas 104 and 106. Transistors each corresponding to the access transistor of the normal MRAM cell NMC are not disposed.

As to the patterning of the access transistors of the normal MRAM cells in this case, the regularity of the patterns is maintained by the dummy access transistors of the first shape dummy cells FDM contained in the internal first shape dummy area 102, and accurate patterning is hence realized. The active region at the surface of the substrate region and the gate word line of the first gate wiring layer 1G are formed with respect to each access transistor. The wirings included in the second metal wiring layer M2 are used for word line piling. Thus, as to the patterning of each access transistor, the influence of a step between lower layers is small, and a shift in patterning is sufficiently ensured by the dummy transistor of the first shape dummy area.

On the other hand, the variable magnetoresistive elements VR are provided between the fourth metal wiring layer M4 and the fifth metal wiring layer M5 and formed in the layer above the access transistors. The variable magnetoresistive element is greatly affected by the step in the bed. In order to suppress variations in the resistance characteristics of the variable magnetoresistive element VR, there is a need to maintain sufficient flatness and set variations in the step as small as possible at the variable magnetoresistive element. This is because the film thickness of the variable magnetoresistive element VR of the normal MRAM cell greatly influences its resistance value and if there is a small step since an adjustment to the film thickness is made in a CMP (Chemical Mechanical Polishing) process in particular, it causes an influence on the film thickness of each layer for the variable magnetoresistive element of the normal MRAM cell, and a small change in the film thickness exerts a great influence on the resistance value of the variable magnetoresistive element of each normal MRAM cell. Accordingly, the shape dummy variable magnetoresistive elements larger in number than the shape dummy transistors for the access transistors are provided, and a step in the magnetoresistive element layer TMR at the peripheral portion of the normal cell area 100 can be set as small as possible.

The second shape dummy area 104 does not particularly need to dispose the dummy access transistors for having the regularity of the patterns for the access transistors. Thus, the active region 130 for applying a substrate bias and the first metal wiring 133 included in the first metal wiring layer M1 are disposed in the second shape dummy area 104. Consequently, there is no need to additionally provide the region for applying the substrate bias. Further, an increase in the layout area of the memory subarray 2 can be suppressed.

Also at the third shape dummy area 106, the third shape dummy cell TDM does not need to provide the dummy access transistors for maintaining the patterning of the access transistors below the local wiring 146. A peripheral transistor layout area 140 is provided in this area. Transistors and wirings for a peripheral circuit are disposed in the peripheral transistor layout area 140. Thus, even if many shape dummy variable magnetoresistive elements are disposed to maintain the regularity of patterning of the variable magnetoresistive elements VR of the normal MRAM cells, components of other circuits are disposed in the shape dummy cell area to enable an improvement in the use efficiency in areas. Correspondingly, an increase in the layout area of the memory cell array due to the layout of the shape dummy cells can be suppressed. It is thus possible to reduce variations in the resistance characteristics of the variable magnetoresistive element of each normal MRAM cell while suppressing an increase in the area of the memory subarray.

Incidentally, the number of the first shape dummy cells FDM disposed in the second shape dummy area 102, and the number of the second shape dummy cell SDM and the third shape dummy cell TDM are respectively defined to a suitable number in consideration of respective ranges for maintaining the regularity of patterning of the access transistors of the normal MRAM cell and maintaining the regularity of patterning of the variable magnetoresistive elements VR.

Incidentally, the shape dummy cells FDM, SDM and TDM shown in FIG. 29(B) are disposed similarly at the memory subarray 2 also in the row direction.

A drive end of the bit line BL is provided outside the third shape dummy area. The corresponding bit line is driven by an unillustrated drive circuit. This is done because the variable magnetoresistive element of the third shape dummy cell is disposed in the layer above the peripheral circuit transistor to thereby avoid the collision between its upper layer wiring and the wiring for drive.

As shown in FIG. 29(B) as above, the shape dummy cells are respectively formed using the first gate wiring 1G to the first through fifth metal wiring layers M1 through M5 and the layer wirings of the local wiring layer LS. Therefore, the regularity of the patterns for the normal MRAM cells contained in the normal cell area 100 can be maintained sufficiently and their steps can be reduced sufficiently. Further, variations in the shape/film thickness due to the step or the like between the variable magnetoresistive elements can be reduced, and variations in their initial resistance values can be suppressed sufficiently.

Figure 30:
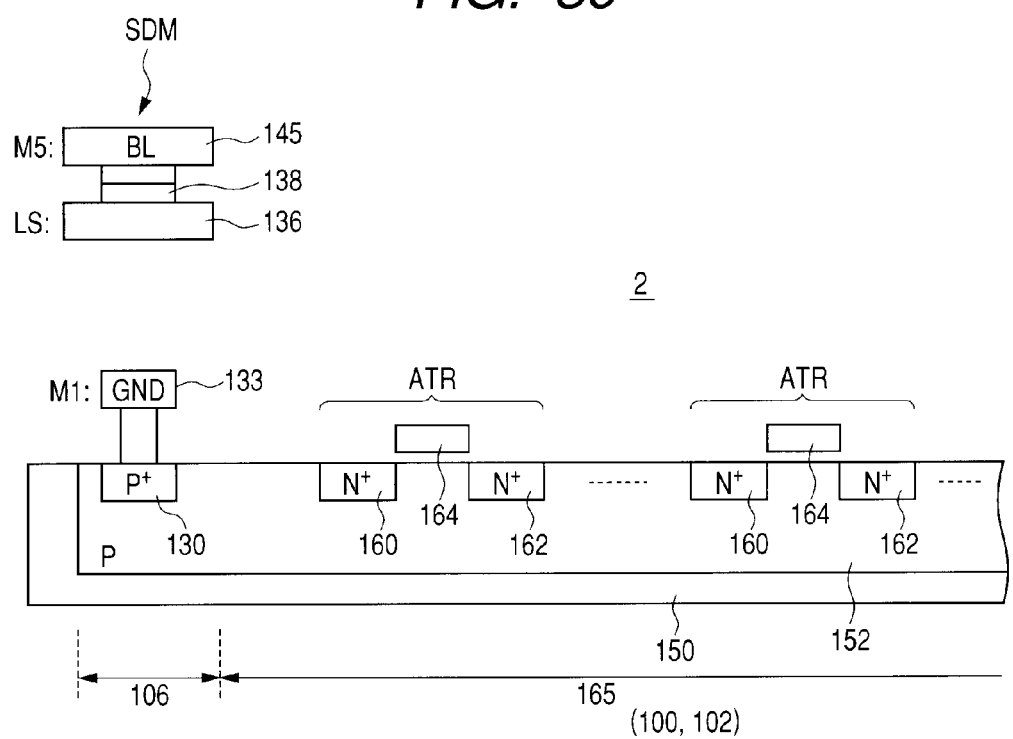
FIG. 30 is a diagram concretely showing a second shape dummy area shown in FIG. 29.

FIG. 30 is a diagram schematically showing a configuration of a bias application section of the second shape dummy area 104 shown in FIG. 29(B). In FIG. 30, the memory subarray 2 is formed in a P well (substrate region) 152 lying over a semiconductor substrate 150. N-type impurity regions 160 and 162 that configure access transistors ATR, and gate wirings 164 are provided at the surface of the P well 152. These access transistors ATR are separated from one another by unillustrated device isolation films (e.g., shallow trench isolation films). Since the gate wirings 164 configure word lines for the dummy access transistors and the normal MRAM cells, reference numerals 164 are used in FIG. 30. The drain and source impurity regions 160 and 162 are also similar.

The first shape dummy area 102 and the normal cell area 100 are disposed in the memory cell area 165.

A P-type impurity region 130 is provided in the second shape dummy area 106 as an active region 130. The P-type impurity region (active region) 130 is coupled to a ground node GND by its corresponding first metal wiring 133. The P-type well 152 is maintained at a ground voltage level by the wiring 133 and the active region 130, thereby achieving stabilization of a threshold voltage of each access transistor and a reduction in backgate bias effect.

As shown in FIG. 30, the impurity region 130 for applying a substrate bias and the first metal wiring 133 that configures a bias voltage transfer line are disposed to overlap with variable magnetoresistive elements (136, 138 and 145) of their upper shape dummy cell as viewed on a plane basis. Thus, there is no need to provide the region for application of the substrate bias additionally, and an increase in the layout area of the memory subarray 2 can be suppressed.

Incidentally, the second shape dummy area 104 is disposed at the outer periphery of the first shape dummy area 102 in FIG. 30. Thus, the impurity regions (active regions) 130 each used to apply the substrate bias may respectively be disposed at the ends in the row and column directions, of the memory subarray 2.

Figure 31:
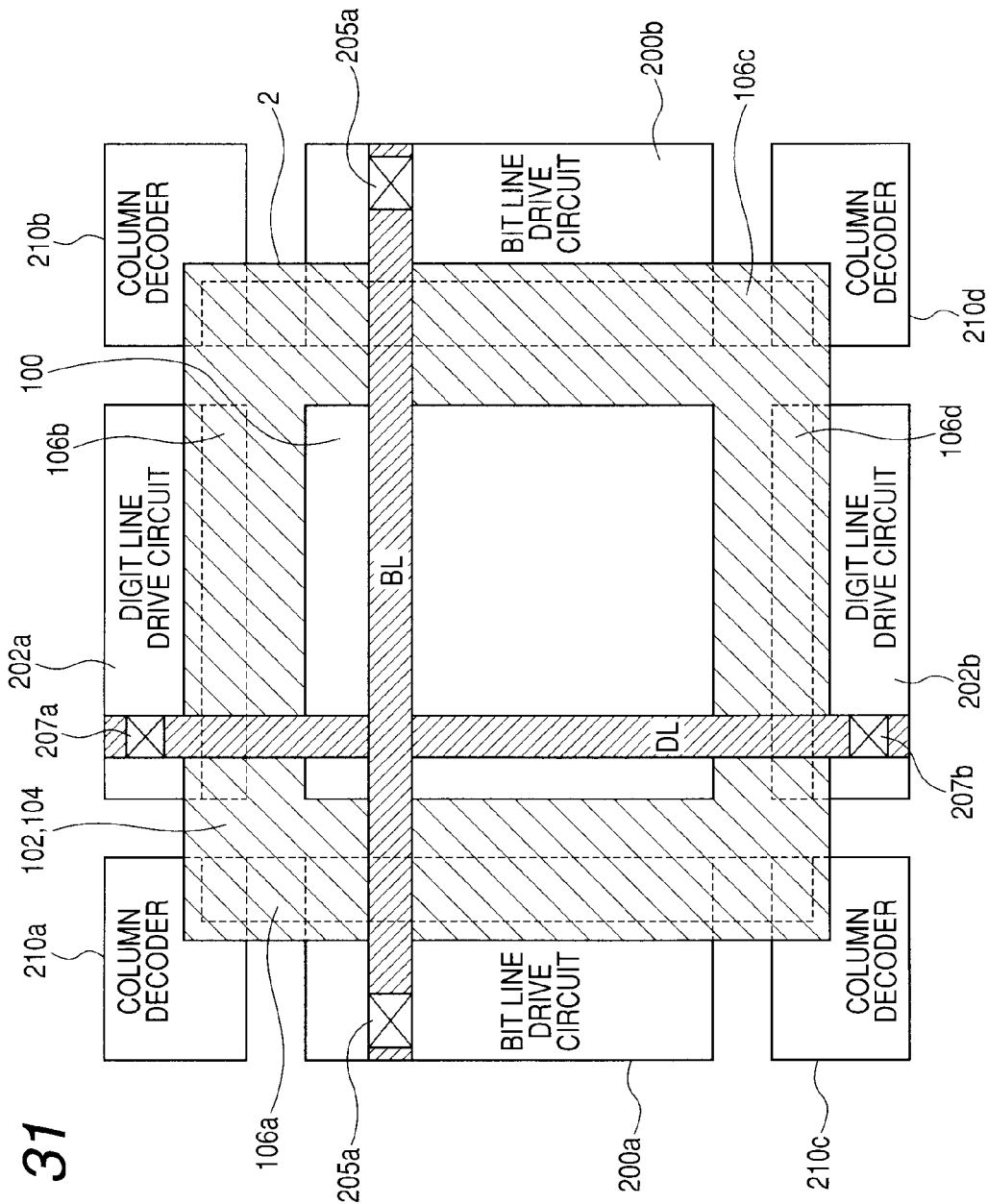
FIG. 31 is a diagram schematically illustrating a layout of a third shape dummy area shown in FIG. 29 and its peripheral circuits.

FIG. 31 is a diagram schematically showing a layout of the third shape dummy area 106 shown in FIGS. 29(A) and 29(B) and its peripheral normal circuits. In FIG. 31, the memory subarray 2 includes a normal cell area 100 located in the center thereof, its peripheral shape dummy areas 102 and 104, and a third shape dummy area 106 provided at its outer periphery. The third shape dummy area 106 is divided into four sub-areas 106a, 106b, 106c and 106d along the four sides of the memory subarray 2.

At the periphery of the memory subarray 2, bit line drive circuits 200a and 200b are disposed on both sides of a bit line BL as the peripheral circuits. Digit line drive circuits 202a and 202b are disposed at opposite both ends of a digit line DL. Column decoders 210a through 210d are respectively disposed corresponding to the four corners of the memory subarray 2.

At the bit line drive circuits 200a and 200b, bit line drivers corresponding to the bit line drivers (BL drivers) BDVE and BDVW shown in FIG. 3 previously are disposed corresponding to the respective bit lines BL. The bit line drive circuits 200a and 200b are disposed so as to overlap with the third shape dummy sub-areas 106a and 106c partly. Transistors that receive a column selection signal and write data therein and receive a control signal therein are disposed in the third shape dummy sub-areas 106a and 106c. The drive transistors for driving the bit lines BL according to the write data are disposed in their corresponding areas lying outside the third shape dummy sub-areas 106a and 106c. The drive transistors for the bit line drivers are coupled to their corresponding outermost ends 205a and 205b of the bit lines BL. Thus, portions for coupling the bit line BL and the bit line drive transistors can be laid out without being affected by the layout regions of their upper dummy variable magnetoresistive elements.

The digit line drive circuits 202a and 202b are also disposed in such a manner that their partial regions overlap with the shape dummy sub-areas 106b and 106d. Digit line drivers are respectively disposed also in the digit line drive circuits 202b and 202a and drive the corresponding digit line DL in accordance with a row selection signal and a timing signal. The digit line DL is of a wiring layer lying in a layer below the local wiring 136. The digit line DL does not particularly need to be driven by its coupling ends 207a and 207b in the areas lying outside the sub-areas 106b and 106d in particular. Displaying digit line drive transistors outside these shape dummy sub-areas 106b and 106d makes it possible to dispose relatively large drive transistors (they do not need to be sensitive to the sizes of the upper dummy shape variable magnetoresistive elements).

Incidentally, the digit line drivers for the digit line drive circuits 202a and 202b are shown in FIG. 31 so as to be disposed at both ends of the digit lines DL in association with the digit lines DL. However, each of the digit lines DL merely needs to allow the current to flow in a predetermined direction upon data writing regardless of the logical values of write data. Such a configuration that one end of the digit line DL is always coupled to, for example, a power node and the other end thereof is coupled to a ground node by its corresponding digit line drive transistor may be utilized. In this case, the digit line drive circuit is provided on one side of the digit line DL.

As an alternative to it, the digit line drive circuit 202 (202a or 202b) may be provided on one end side of the digit line DL, and the word line drive circuits for driving the corresponding word line may be disposed on the opposite ends. The word line drivers (WL drivers WDW and WDE of FIG. 3) contained in the word line drive circuits merely need to drive the second metal wiring. The drive transistors of the word line drivers may be disposed within the sub-area 106b or 106d (because the collision between the wiring for the upper variable magnetoresistive element and the wiring for the word line drive transistor do not occur).

Incidentally, column selection signals from the column decoders 210a through 210d are supplied to their corresponding bit line drivers contained in the bit line drive circuits 200a and 200b upon data writing. Upon data reading, they are supplied to their corresponding read column selection gates.

According to the fourth embodiment of the present invention as described above, the shape dummy areas are provided at the memory subarray. The shaped dummy areas in which the dummy elements for the variable magnetoresistive elements are disposed, are disposed outside the dummy shape areas in which the dummy cells each having the same structure as the normal MRAM cell are disposed. Thus, the patterning of the variable magnetoresistive elements for the normal MRAM cells can be performed accurately, and the peripheral circuits can be disposed so as to overlap as viewed on the plane basis within the shape dummy areas, thereby making it possible to suppress increases in the layout region of each peripheral circuit and the area of the memory subarray.

Incidentally, as a mode for laying out the normal MRAS cells in the configuration in which the shape dummy cells are disposed, either of an open bit line configuration (refer to the first embodiment) and a pseudo-folded bit line configuration (MRAM cell and dummy reference cell are selected in parallel within the same memory subarray) may be applied.

In the above configuration, the MRAM cells which perform the writing of data using a current-induced magnetic field, like the TMR element or MTJ element, are shown as the variable magnetoresistive elements. As the MRAM cell, however, a spin injection type MRAM cell for setting the direction of magnetization of a free layer for each variable magnetoresistive element by a spin deflection current may be used. In the case of the spin injection type MRAM, however, there is a need to provide mesh structures of source lines in separate form individually every area (IO blocks) for input/output data bits. This is because when a write current is supplied in the case of the spin injection type MRAM, the direction of the current is set between the bit line and the source line in accordance with the logical value of write data and thereby the current is caused to flow.

An MRAM according to the present invention may be applied to a built-in MRAM application that configures a system with being formed over the same semiconductor substrate together with another processor or the like. The MRAM alone may be utilized. In either case, an MRAM can be realized which is reduced in layout area and capable of performing data access at high speed and accurately.

Incidentally, in the first through fourth embodiments, the respective embodiments may be used in combination suitably. The respective embodiments may be applied individually.

What is claimed is:

1. A magnetic memory device comprising:
   a memory array in which a plurality of MRAM cells arranged in matrix form and each having a series body of a variable magnetoresistive element and a selection transistor are disposed;
   a plurality of word lines disposed corresponding to rows of the MRAM cells and coupled with gates of the selection transistors of the MRAM cells of the corresponding rows respectively;
   a plurality of bit lines disposed corresponding to columns of the MRAM cells and respectively coupled to the selection transistors of the MRAM cells of the corresponding columns; and
   a shape dummy cell area disposed around the memory array and provided with a plurality of shape dummy cells each of which at least has an element of the same shape as the variable magnetoresistive element of the MRAM cell and which are disposed in alignment with the MRAM cells, wherein the shape dummy cell area has a first shape dummy area in which each first shape dummy cell of the same structure as the MRAM cell, having a variable magnetoresistive element and a selection transistor is disposed, a second shape dummy area which is disposed at an outer periphery of the first shape dummy area and in which a second shape dummy cell having a dummy magnetoresistive element of the same structure as the variable magnetoresistive element of the MRAM cell is disposed, and a third shape dummy area which is disposed at an outer periphery of the second shape dummy area and in which a third shape dummy cell having a dummy magnetoresistive element of the same structure as the variable magnetoresistive element is disposed, wherein at the second shape dummy area, an element for applying a bias voltage to a substrate region of the memory array is disposed in a region below the dummy magnetoresistive element, and wherein at the third shape dummy area, a transistor of a peripheral circuit for obtaining access to the memory array is disposed in a lower region of the dummy magnetoresistive element.

* * * * *